US012740110B2

United States Patent
(12) United States Patent
Li et al.

(10) Patent No.: US 12,740,110 B2
(45) Date of Patent: Sep. 15, 2026

(54) INTEGRATED TRANSISTOR HAVING AN OVER-THE-CHANNEL ETCH-STOP ISOLATION REGION

(71) Applicant: International Business Machines Corporation, Armonk, NY (US)

(72) Inventors: Juntao Li, Cohoes, NY (US); Julien Frougier, Albany, NY (US); Min Gyu Sung, Latham, NY (US); Chanro Park, Clifton Park, NY (US); Ruilong Xie, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 572 days.

(21) Appl. No.: 18/339,294

(22) Filed: Jun. 22, 2023

(65) Prior Publication Data

US 2024/0429280 A1 Dec. 26, 2024

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 84/0167* (2025.01); *H10D 84/0188* (2025.01); *H10D 84/038* (2025.01); *H10D 84/85* (2025.01)

(58) Field of Classification Search

CPC .... H10D 62/121; H10D 30/014; H10D 84/85; H10D 30/6757; H10D 64/017; H10D 84/0167; H10D 30/6735; H10D 30/43; H10D 84/038; H10D 84/0188

USPC .......................................................... 257/288

See application file for complete search history.

(56) References Cited

U.S. PATENT DOCUMENTS

| | | | |
|---|---|---|---|
| 9,614,056 | B2 | 4/2017 | Xie et al. |
| 11,201,152 | B2 | 12/2021 | Xie et al. |

(Continued)

FOREIGN PATENT DOCUMENTS

| | | |
|---|---|---|
| CN | 115906723 A | 4/2023 |

OTHER PUBLICATIONS

Gupta et al. "A comprehensive study of nanosheet and forksheet SRAM for beyond N5 node." IEEE Transactions on Electron Devices 68.8 (2021): 3819-3825.

(Continued)

*Primary Examiner* — Norman D Richards
*Assistant Examiner* — Colin Russell McCutcheon
(74) *Attorney, Agent, or Firm* — Cantor Colburn LLP; Kimberly Zillig

(57) ABSTRACT

Embodiments of the invention are directed to an integrated circuit (IC) that includes a channel that includes a nanosheet stack; an etch-stop isolation (ESI) region over the nanosheet stack; and a portion of a first type of gate element between the ESI region and the nanosheet stack. The ESI region is operable to prevent etching the portion of the first type of gate element that is between the ESI region and the nanosheet stack.

20 Claims, 17 Drawing Sheets

(56) References Cited

U.S. PATENT DOCUMENTS

| | | | | |
|---|---|---|---|---|
| 2020/0075720 | A1* | 3/2020 | Cheng | H10D 64/68 |
| 2021/0210489 | A1 | 7/2021 | Zhang et al. | |
| 2023/0066979 | A1 | 3/2023 | Frougier et al. | |
| 2023/0090092 | A1* | 3/2023 | Lilak | H10D 62/121<br>257/369 |
| 2023/0099254 | A1 | 3/2023 | Ando et al. | |
| 2024/0145541 | A1* | 5/2024 | Kim | H10D 62/121 |

OTHER PUBLICATIONS

Horiguchi et al. "Patterning challenges and opportunities in nanosheet device architectures." Advanced Etch Technology and Process Integration for Nanopatterning XI. SPIE, https://www.spiedigitallibrary.org/conference-proceedings-of-spie/PC12056/PC1205608/Patterning-challenges-and-opportunities-in-nanosheet-device-architectures/10.1117/12.2615984.short (Retreived Jun. 12, 2023), 2022: 12 pages.

Mertens et al., "Forksheet FETs with Bottom Dielectric Isolation, Self-Aligned Gate Cut, and Isolation between Adjacent Source-Drain Structures." International Electron Devices Meeting (IEDM). IEEE, 2022. pages 555-558.

Mukesh et al., "A Review of the Gate-All-Around Nanosheet FET Process Opportunities." Electronics 11.21 (2022): 12 pages.

Ritzenthaler et al. "Comparison of electrical performance of co-integrated forksheets and nanosheets transistors for the 2nm technological node and beyond." International Electron Devices Meeting (IEDM). IEEE, 2021, pp. EDM21-561 to EDM21-564.

Weckx et al., "Novel forksheet device architecture as ultimate logic scaling device towards 2nm," International Electron Devices Meeting (IEDM), 2019, 4 pages.

* cited by examiner

Top-down View
NS
Y1
Y2
X
Gate
Nanosheet-based reference structure 100

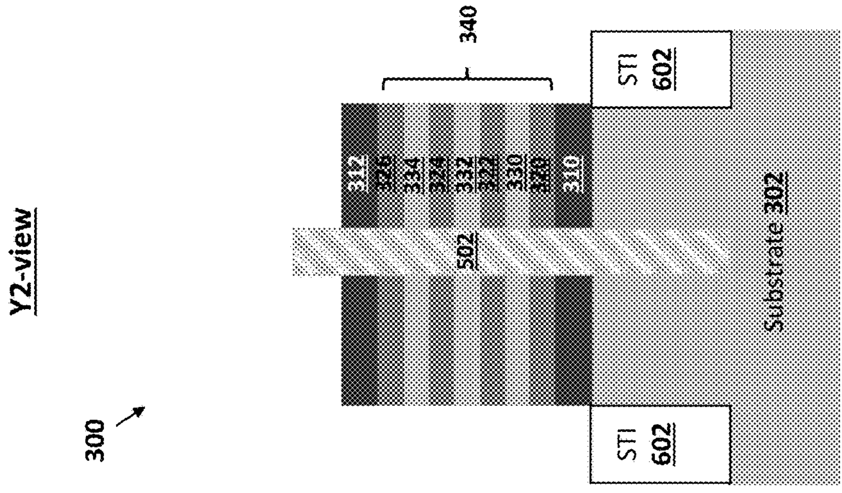
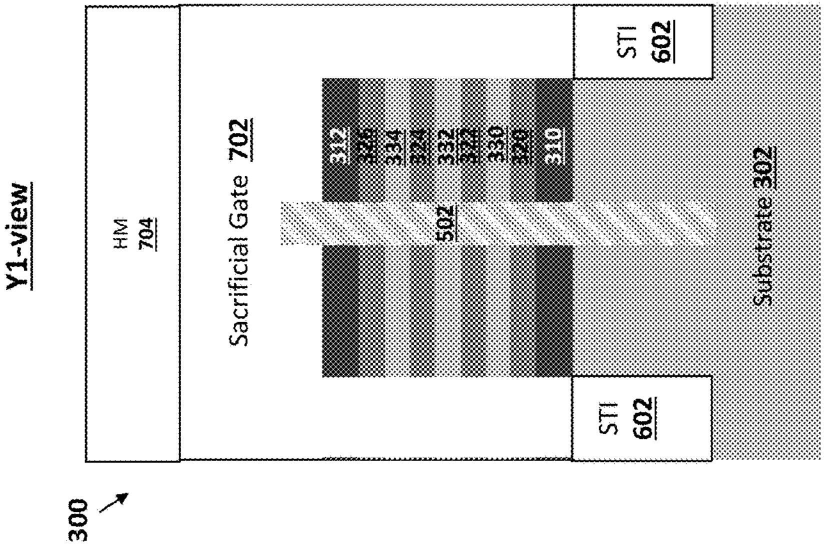
FIG. 7
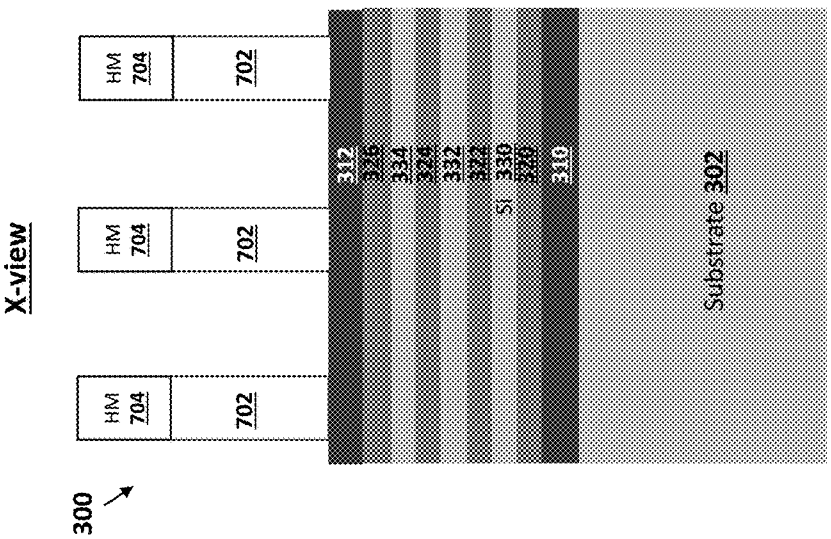

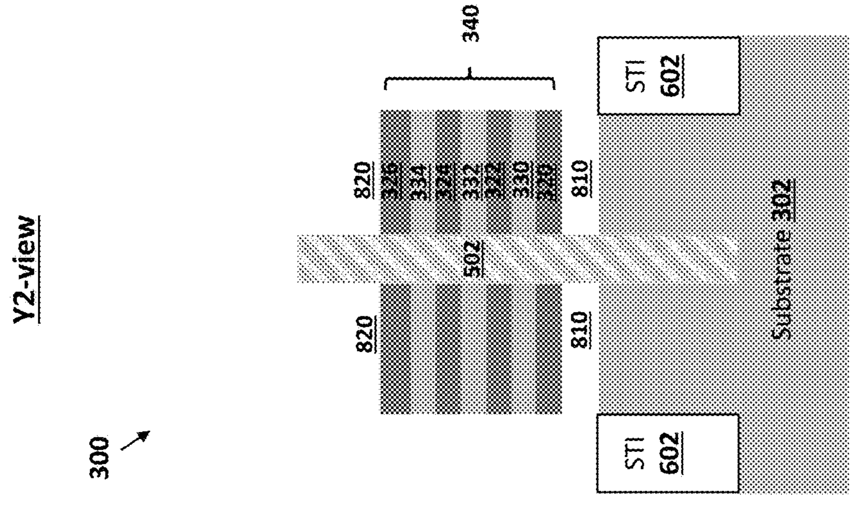
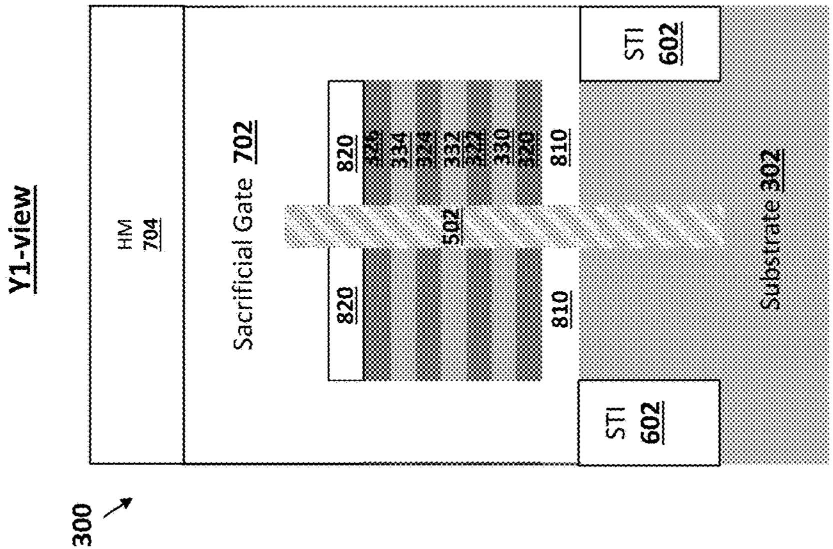
FIG. 8
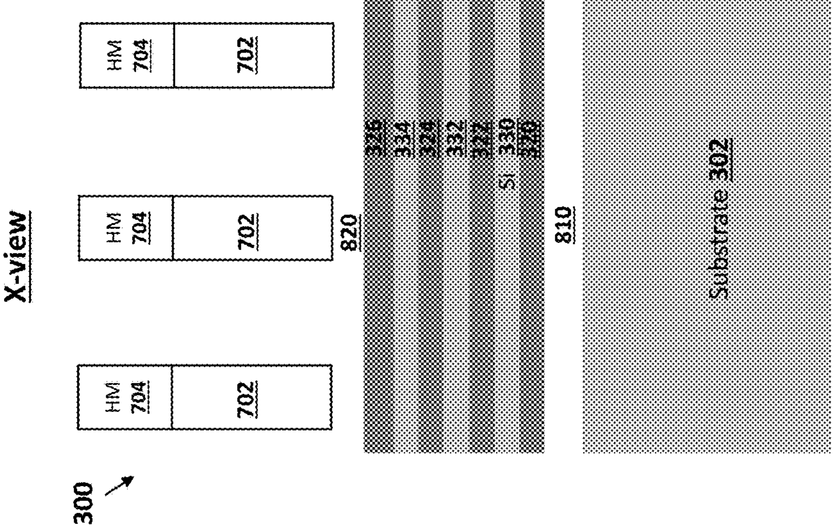

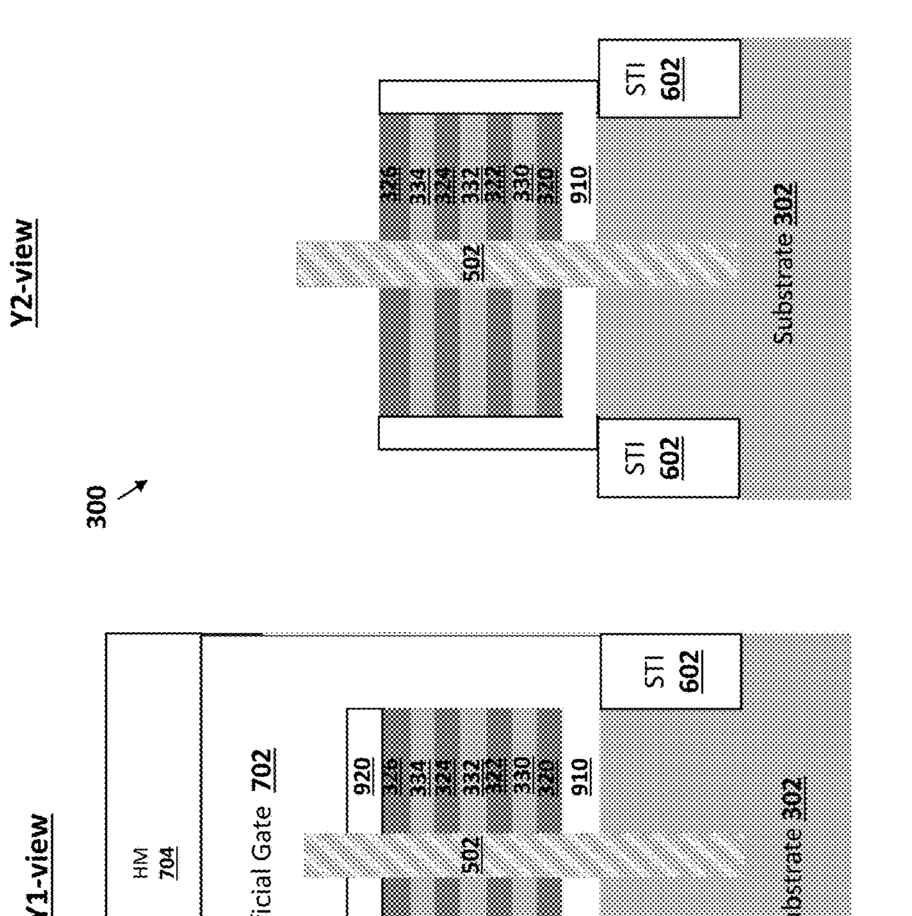
FIG. 9
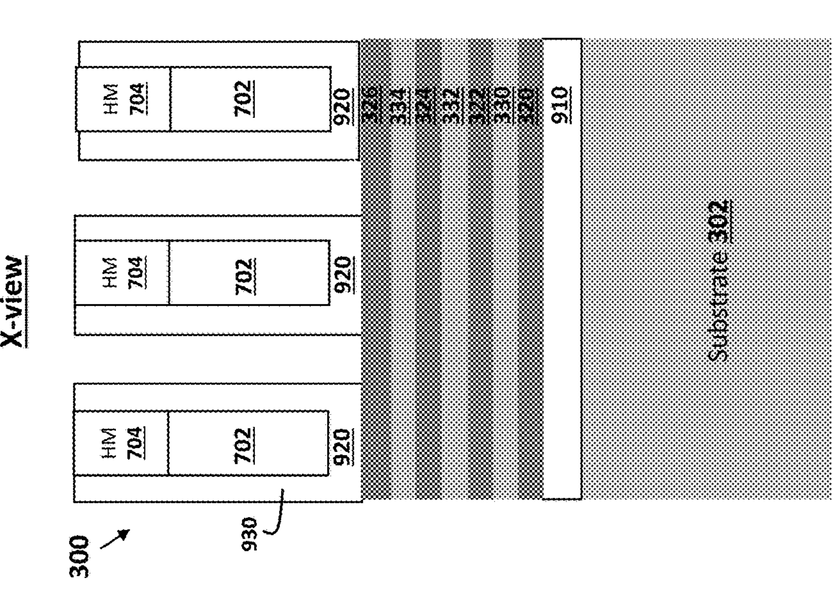

INTEGRATED TRANSISTOR HAVING AN OVER-THE-CHANNEL ETCH-STOP ISOLATION REGION

BACKGROUND

The present invention relates in general to fabrication methods and resulting structures for semiconductor devices. More specifically, the present invention relates to fabrication methods and resulting structures for an integrated n-type and p-type transistor architecture having an etch-stop isolation region positioned over a channel region.

In contemporary semiconductor device fabrication processes, a large number of metal oxide semiconductor field effect transistors (MOSFETs), such as n-type field effect transistors (NFETs) and p-type field effect transistors (PFETs), are fabricated on a single wafer. Non-planar MOSFET architectures (e.g., fin-type FETs (FinFETs)) can provide increased device density and increased performance over planar MOSFETs.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as nanosheets or similar nanostructure. For example, a so-called gate-all-around (GAA) nanosheet FET is non-planar architecture that provides a relatively small FET footprint by forming the channel region as a series of thin nanosheets (e.g., about 3 nm to about 8 nm thick). In a known GAA configuration, a nanosheet-based FET includes a source region, a drain region and stacked, spaced-apart nanosheet channels between the source and drain regions. A gate surrounds the stack and each spaced-apart nanosheet channel to regulate electron flow through the nanosheet channels between the source and drain regions.

So-called fork-sheet (or integrated) FETs are a type of GAA transistor architecture in which a set of stacked, spaced-apart nanosheets is divided by a dielectric wall that separates the stack into an NFET side and a PFET side integrated in the same structure. This is different from existing GAA nanosheet FETs that fabricates NFETs and PFETs as separate devices. Fork-sheet FETs enable tighter N-to-P (or N2P) spacing and reductions in area scaling. A conventional fork-sheet FET can achieve, for example, a 42 nm contacted gate pitch (CPP), along with a 16 nm metal pitch. In comparison, a conventional GAA nanosheet FET can achieve, for example, a 45 nm CPP and a 30 nm metal pitch.

Although the relatively close N2P spacing of fork-sheet FETs provides benefits, close N2P spacing also results in correspondingly smaller patterning process margins when fabricating a fork-sheet FET. For example, because NFETs and PFETs require different work function metals (WFMs) in their gates, it is necessary to form an NFET-compatible WFM for the NFET side of the fork-sheet FET, while also forming a PFET-compatible WFM for the PFET side of the fork-sheet FET. The fabrication operations used to form NFET WFMs and PFET WFMs for fork-sheet FETs conventionally involve some form of gate metal etching. The smaller patterning process margins in fork-sheet FETs increase the likelihood that such gate etching operations will result in an undesirable level of gat etch undercutting that enables the NFET WFM to encroach onto the PFET-side of the fork-sheet FET and contact a PFET channel nanosheet (and vice versa), thereby negatively impacting device performance.

SUMMARY

Embodiments of the invention are directed to an integrated circuit (IC) that includes a nanosheet stack; an etch-stop isolation (ESI) region over the nanosheet stack; and a portion of a first type of gate element between the ESI region and the nanosheet stack. The ESI region is operable to prevent etching the portion of the first type of gate element that is between the ESI region and the nanosheet stack.

The above-described embodiments of the invention provide technical benefits and technical effects. For example, the location of the ESI region over the nanosheet stack protects the nanosheet stack from etch operations applied to the first type of gate element during fabrication of the IC. More specifically, in some embodiments of the invention, the fabrication operations used to form the first type of gate element includes applying a gate etch operation to the first type of gate element, which can result in the first type of gate element being undercut. Without the presence of the ESI region over the nanosheet stack, the undercut region can be sufficiently extensive to expose portions of the nanosheet stack, thereby exposing portions of the channel and negatively impacting the IC's performance. Because the ESI region is over the nanosheet stack, the undercut region being extensive only exposes portions of the ESI region and does not expose portions of the nanosheet stack, thereby enabling the first type of gate element between the ESI region and the nanosheet stack to remain intact and preventing the IC's performance from being negatively impacted by the presence of the undercut region.

In addition to one or more of the features described above, or as an alternative to any of the foregoing embodiments of the invention, the IC further includes a portion of a second type of gate element over the ESI region, wherein the ESI region is operable to electrically isolate the portion of the second type of gate material from the nanosheet stack.

The above-described embodiments of the invention provide technical benefits and technical effects. For example, the location of the ESI region over the nanosheet stack electrically isolates the nanosheet stack from a portion of a second type of gate element that can be present adjacent the first gate element and above the ESI region. More specifically, in some embodiments of the invention, the fabrication operations used to form the first type of gate element includes applying a gate etch operation to the first type of gate element, which can result in the first type of gate element being undercut. The second gate element is formed on another portion of the IC and, because of the undercut, extends over the ESI region. Without the presence of the ESI region over the nanosheet stack, the undercut region can be sufficiently extensive to allow the second gate element to extend over and contact the nanosheet stack, thereby negatively impacting the IC's performance. Because the ESI region is over the nanosheet stack, the undercut region being extensive only exposes portions of the ESI region to the second gate element and does not expose portions of the nanosheet stack to the second gate element, thereby electrically isolating the nanosheet stack from the second gate element.

In addition to one or more of the features described above, or as an alternative to any of the foregoing embodiments of the invention, the first type of gate element includes a first work function mental (WFM), and the second type of gate element includes a second WFM that is different from the first WFM.

The above-described embodiments of the invention provide technical benefits and technical effects. For example, the location of the ESI region over the nanosheet stack electrically isolates the nanosheet stack from a portion of a second type of gate element that can be present adjacent the first gate element and above the ESI region. More specifically, in some embodiments of the invention, the fabrication operations used to form the first type of gate element includes applying a gate etch operation to the first type of gate element, which can result in the first type of gate element being undercut. The second gate element is formed on another portion of the IC and, because of the undercut, extends over the ESI region. Without the presence of the ESI region over the nanosheet stack, the undercut region can be sufficiently extensive to allow the second gate element to extend over and contact the nanosheet stack. Because the first type of gate element includes a first work function mental (WFM), because the second type of gate element includes a second WFM that is different from the first WFM, and because the ESI region is over the nanosheet stack, the undercut region being extensive only exposes portions of the ESI region to the second WFM of the second gate element and does not expose portions of the nanosheet stack to the second WFM of the second gate element. Accordingly, the ESI region electrically isolates the nanosheet stack from the second gate element and prevents the second WFM of the second gate element from contacting the nanosheet stack and negatively impacting the IC's performance.

Embodiments of the invention are also directed to an IC that includes a first channel that includes a first nanosheet stack; a second channel that includes a second nanosheet stack separated from the first nanosheet stack by a first isolation region; a second isolation region including an ESI region over the first nanosheet stack; a portion of a first type of gate element between the ESI region and the first nanosheet stack; and a second type of gate element over and around the second nanosheet stack. The ESI region is operable to prevent etching the portion of the first type of gate element that is between the ESI region and the first nanosheet stack.

The above-described embodiments of the invention provide technical benefits and technical effects. For example, the location of the ESI region over the first nanosheet stack protects the first nanosheet stack from etch operations applied to the first type of gate element during fabrication of the IC. More specifically, in some embodiments of the invention, the fabrication operations used to form the first type of gate element includes applying a gate etch operation to the first type of gate element, which can result in the first type of gate element being undercut. Without the presence of the ESI region over the first nanosheet stack, the undercut region can be sufficiently extensive to expose portions of the first nanosheet stack, thereby exposing portions of the channel and negatively impacting the IC's performance. Because the ESI region is over the first nanosheet stack, the undercut region being extensive only exposes portions of the ESI region and does not expose portions of the first nanosheet stack, thereby enabling the first type of gate element between the ESI region and the first nanosheet stack to remain intact and preventing the IC's performance from being negatively impacted by the presence of the undercut region.

Additionally, the location of the ESI region over the first nanosheet stack electrically isolates the first nanosheet stack from a portion of a second type of gate element that can be present adjacent the first gate element and above the ESI region. More specifically, in some embodiments of the invention, the fabrication operations used to form the first type of gate element includes applying a gate etch operation to the first type of gate element, which can result in the first type of gate element being undercut. The second gate element is formed on another portion of the IC and, because of the undercut, extends over the ESI region. Without the presence of the ESI region over the first nanosheet stack, the undercut region can be sufficiently extensive to allow the second gate element to extend over and contact the first nanosheet stack, thereby negatively impacting the IC's performance. Because the ESI region is over the first nanosheet stack, the undercut region being extensive only exposes portions of the ESI region to the second gate element and does not expose portions of the first nanosheet stack to the second gate element, thereby electrically isolating the first nanosheet stack from the second gate element.

In addition to one or more of the features described above, or as an alternative to any of the foregoing embodiments of the invention, the first type of gate element includes a first work function mental (WFM), and the second type of gate element includes a second WFM that is different from the first WFM.

The above-described embodiments of the invention provide technical benefits and technical effects. For example, the location of the ESI region over the first nanosheet stack electrically isolates the first nanosheet stack from a portion of a second type of gate element that can be present adjacent the first gate element and above the ESI region. More specifically, in some embodiments of the invention, the fabrication operations used to form the first type of gate element includes applying a gate etch operation to the first type of gate element, which can result in the first type of gate element being undercut. The second gate element is formed on another portion of the IC and, because of the undercut, extends over the ESI region. Without the presence of the ESI region over the first nanosheet stack, the undercut region can be sufficiently extensive to allow the second gate element to extend over and contact the first nanosheet stack. Because the first type of gate element includes a first work function mental (WFM), because the second type of gate element includes a second WFM that is different from the first WFM, and because the ESI region is over the first nanosheet stack, the undercut region being extensive only exposes portions of the ESI region to the second WFM of the second gate element and does not expose portions of the first nanosheet stack to the second WFM of the second gate element. Accordingly, the ESI region electrically isolates the first nanosheet stack from the second gate element and prevents the second WFM of the second gate element from contacting the first nanosheet stack and negatively impacting the IC's performance.

Embodiments of the invention also include fabrication methods for forming an IC having substantially the same features, functions, technical benefits, and technical effects as the above-described IC.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 3-17 depict multiple cross-sectional views of a portion of an IC having a novel fork-sheet FET architecture after various fabrication operations for forming the novel fork-sheet FET, in which:

FIG. 3 depicts cross sectional views of the portion of the IC having the novel fork-sheet FET architecture after initial fabrication operations in accordance with aspects of the present invention;

FIG. 4 depicts cross-sectional views of the portion of the IC having the novel fork-sheet FET architecture after additional fabrication operations in accordance with aspects of the present invention;

FIG. 5 depicts cross-sectional views of the portion of the IC having the novel fork-sheet FET architecture after additional fabrication operations in accordance with aspects of the present invention;

FIG. 6 depicts cross-sectional views of the portion of the IC having the novel fork-sheet FET architecture after additional fabrication operations in accordance with aspects of the present invention;

FIG. 7 depicts cross-sectional views of the portion of the IC having the novel fork-sheet FET architecture after additional fabrication operations in accordance with aspects of the present invention;

FIG. 8 depicts cross-sectional views of the portion of the IC having the novel fork-sheet FET architecture after additional fabrication operations in accordance with aspects of the present invention;

FIG. 9 depicts cross-sectional views of the portion of the IC having the novel fork-sheet FET architecture after additional fabrication operations in accordance with aspects of the present invention;

FIG. 10 depicts cross-sectional views of the portion of the IC having the novel fork-sheet FET architecture after additional fabrication operations in accordance with aspects of the present invention;

FIG. 11 depicts cross-sectional views of the portion of the IC having the novel fork-sheet FET architecture after additional fabrication operations in accordance with aspects of the present invention;

FIG. 12 depicts cross-sectional views of the portion of the IC having the novel fork-sheet FET architecture after additional fabrication operations in accordance with aspects of the present invention;

FIG. 13 depicts cross-sectional views of the portion of the IC having the novel fork-sheet FET architecture after additional fabrication operations in accordance with aspects of the present invention;

FIG. 14 depicts cross-sectional views of the portion of the IC having the novel fork-sheet FET architecture after additional fabrication operations in accordance with aspects of the present invention;

FIG. 15 depicts cross-sectional views of the portion of the IC having the novel fork-sheet FET architecture after additional fabrication operations in accordance with aspects of the present invention;

FIG. 16 depicts cross-sectional views of the portion of the IC having the novel fork-sheet FET architecture after additional fabrication operations in accordance with aspects of the present invention; and FIG. 17 depicts cross-sectional views of the portion of the IC having the novel fork-sheet FET architecture after additional fabrication operations in accordance with aspects of the present invention.

Figure 1:
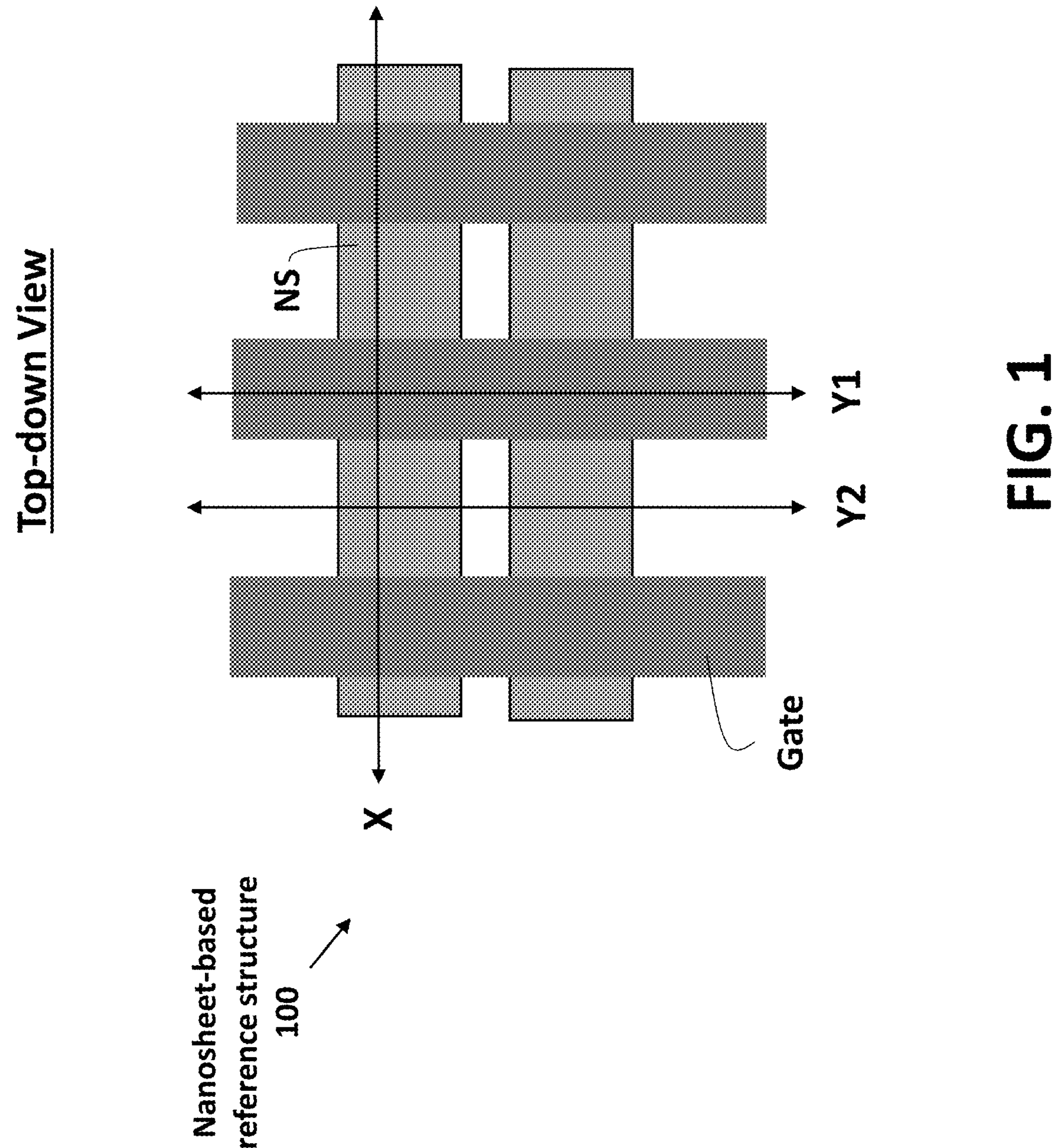
FIG. 1 depicts a top-down view of a simplified nanosheet-based reference structure 101 that provides a reference point for the various cross-sectional views (X-view, Y1-view, and Y2-view) shown in FIGS. 2-17.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two- or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of thin nanosheets (e.g., about 3 nm to about 8 nm thick). In a known GAA configuration, a nanosheet-based FET includes a source region, a drain region and stacked, spaced-apart nanosheet channels between the source and drain regions. A gate surrounds the stacked, spaced-apart nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

To further improve wafer density, so-called fork-sheet FETs are a type of GAA transistor architecture in which a set of stacked, spaced-apart nanosheets is divided by a dielectric wall that separates the stack into an NFET side and a PFET side integrated in the same structure. This is different from existing GAA nanosheet FETs that fabricates NFETs and PFETs as separate devices. Fork-sheet FETs enable tighter N-to-P (or N2P) spacing and reductions in area scaling. A conventional fork-sheet FET can achieve, for example, a 42 nm contacted gate pitch (CPP), along with a 16 nm metal pitch. In comparison, a conventional GAA nanosheet FET can achieve, for example, a 45 nm CPP and a 30 nm metal pitch.

Although the relatively close N2P spacing of fork-sheet FETs provides benefits, close N2P spacing also results in correspondingly smaller patterning process margins when fabricating a fork-sheet FET. For example, because NFETs and PFETs require different WFMs in their gates, it is necessary to form an NFET-compatible WFM for the NFET side of the fork-sheet FET, while also forming a PFET-compatible WFM for the PFET side of the fork-sheet FET. The fabrication operations used to form NFET WFMs and PFET WFMs for fork-sheet FETs conventionally involve some form of gate metal etching. The smaller patterning process margins in fork-sheet FETs increase the likelihood that such gate etching operations will result in an undesirable level of gate etch undercutting that enables the NFET WFM to encroach onto the PFET-side of the fork-sheet FET and contact a PFET channel nanosheet (and vice versa), thereby negatively impacting device performance.

Turning now to an overview of aspects of the invention, embodiments of the invention provide fabrication methods and resulting structures for an IC having a fork-sheet (or integrated) transistor formed therein. The fork-sheet transistor includes an etch stop isolation (ESI) region positioned over a channel region of the fork-sheet transistor. In embodiments of the invention, the fork-sheet FET includes an NFET segment integrated with a PFET segment. The PFET segment includes a first channel, and the NFET segment includes a second channel. The first channel includes a first nanosheet stack; and the second channel includes a second nanosheet stack separated from the first nanosheet stack by a first isolation region. A second isolation region includes the ESI region positioned over the first nanosheet stack. A first type of gate element (e.g., a gate element having a p-type FET WFM) is provided in the PFET segment, and a second type of gate element (e.g., a gate element having an n-type FET WFM) is provided in the NFET segment. A portion of the first type of gate element is between the ESI region and the first nanosheet stack; and the second type of gate element is over and around the second nanosheet stack. The ESI region is operable to prevent etching the portion of the first type of gate element that is between the ESI region and the first nanosheet stack.

The above-described embodiments of the invention provide technical benefits and technical effects. For example, the location of the ESI region over the first nanosheet stack protects the first nanosheet stack from etch operations applied to the first type of gate element during fabrication of the IC. More specifically, in some embodiments of the invention, the fabrication operations used to form the first type of gate element includes applying a gate etch operation to the first type of gate element, which can result in the first type of gate element being undercut. Without the presence of the ESI region over the first nanosheet stack, the undercut region can be sufficiently extensive to expose portions of the first nanosheet stack, thereby exposing portions of the channel and negatively impacting the IC's performance. Because the ESI region is over the first nanosheet stack, the undercut region being extensive only exposes portions of the ESI region and does not expose portions of the first nanosheet stack, thereby enabling the first type of gate element between the ESI region and the first nanosheet stack to remain intact and preventing the IC's performance from being negatively impacted by the presence of the undercut region.

Additionally, the location of the ESI region over the first nanosheet stack electrically isolates the first nanosheet stack from a portion of a second type of gate element that can be present adjacent the first gate element and above the ESI region. More specifically, in some embodiments of the invention, the fabrication operations used to form the first type of gate element includes applying a gate etch operation to the first type of gate element, which can result in the first type of gate element being undercut. The second gate element is formed on another portion of the IC and, because of the undercut, extends over the ESI region. Without the presence of the ESI region over the first nanosheet stack, the undercut region can be sufficiently extensive to allow the second gate element to extend over and contact the first nanosheet stack, thereby negatively impacting the IC's performance. Because the ESI region is over the first nanosheet stack, the undercut region being extensive only exposes portions of the ESI region to the second gate element and does not expose portions of the first nanosheet stack to the second gate element, thereby electrically isolating the first nanosheet stack from the second gate element.

Turning now to a more detailed description of embodiments of the invention, FIG. 1 depicts a two-dimensional top-down view of a simplified nanosheet-based reference structure 100 having nanosheet stacks (NSs) and gates (Gate). The nanosheet-based reference structure 100 provides a reference point for the various cross-sectional views (X-view, Y1-view, Y2-view) shown in FIGS. 2-17. More specifically, the X-view is a side view taken along one NS of the reference structure 100; the Y1-view is an end view taken along the active Gates of the reference structure 100; and the Y2-view is a side vie taken along the Gates. Although the cross-sectional diagrams depicted in FIGS. 2-17 are two-dimensional, the diagrams depicted in FIGS. 2-17 represent three-dimensional structures. Thus, to assist with visualizing the three-dimensional structures, the top-down view of the nanosheet-based reference structure 100 provides a reference point for the various cross-sectional views (the X-view, Y1-view, and the Y2-view) shown in FIGS. 2-17.

Figure 2:
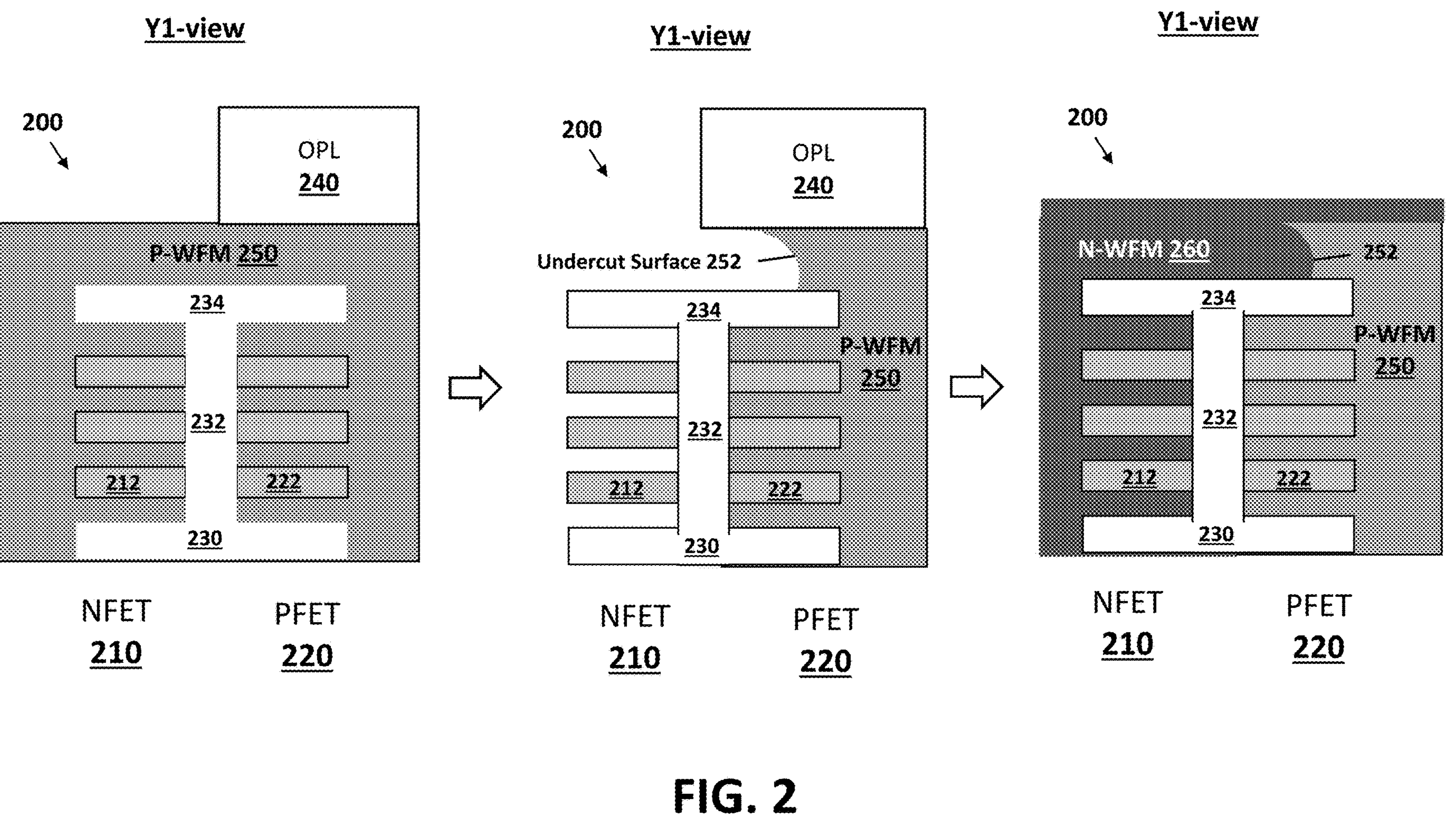
FIG. 2 depicts cross-sectional views of a portion of an IC after fabrication operations for forming a novel fork-sheet FET architecture embodying aspects of the invention.

FIG. 2 depicts three cross-sectional views (all Y1 views) of a portion of an IC having a novel fork-sheet FET architecture (i.e., the semiconductor structure 200) after fabrication operations embodying aspects of the invention. The structures and operations depicted in FIG. 2 provide a simplified example of how embodiments of the invention can be implemented, and FIGS. 3-17 depict a more detailed example of how embodiments of the invention can be implemented. For ease of description, in the discussion that follows, the various iterations of the portion of the IC having a novel fork-sheet FET architecture as it is being fabricated will be referred to as a "semiconductor structure" having a particular reference number (e.g., the semiconductor structure 200 shown in FIG. 2; and/or the semiconductor structure 300 shown in FIGS. 3-17). The same reference number is applied to the "semiconductor structure" throughout the various figures that show different fabrication stages, even though the physical construction of the semiconductor structure has changed from one fabrication stage to another.

Referring now to the leftmost image of FIG. 2, a semiconductor structure 200 is shown after known fabrication operations have been applied to bring the semiconductor structure 200 to the fabrication stage shown. The semiconductor structure 200 includes a first channel that include a stack of spaced-apart nanosheets 222 separated by a fin-shaped dielectric bar 232 from a second channel that includes a stack of spaced-apart nanosheets 212. The spaced-apart nanosheets 222 are on a PFET side 220 of the semiconductor structure 200, and the spaced-apart nanosheets 212 are on an NFET side 210 of the semiconductor structure 200. In accordance with embodiments of the invention a bottom dielectric isolation (BDI) region 230 is coupled to a bottom of the BDI region 230, and an ESI region 234 is coupled to a top of the BDI region 230 and extends over a topmost one of the spaced-apart nanosheets 222. In some embodiments of the invention, a portion of the ESI region 234 is also over the spaced-apart nanosheets 212. The semiconductor structure 200, when fabricated, will function as a fork-sheet FET having a PFET on the PFET side 220 and an NFET on the NFET side 210. Accordingly, a gate element having a WFM (e.g., an N-WFM) compatible with an NFET is needed for the NFET side 210, and a gate element having a WFM (e.g., a P-WFM) compatible with a PFET is needed for the PFET side 220.

To form the P-WFM and the N-WFM, known semiconductor fabrication operations are used to deposit a gate element having a P-WFM 250 over the entire semiconductor structure 200 then planarized. A blocking element is formed over the P-WFM 250 on the PFET side 220. In embodiments of the invention, the blocking element can be an organic planarization layer (OPL) 240. In general, OPLs are used as etch masks for pattern transfers into inorganic substrates, to fill pre-existing features, and to planarize a substrate to allow for larger patterning process windows. As previously noted herein, although the relatively close N2P spacing of fork-sheet FETs provides benefits, close N2P spacing also results in correspondingly smaller patterning process margins when fabricating a fork-sheet FET. As a result of the smaller dimensions of the semiconductor structure 200, there can be a large variation in the fabrication processes used to place the OPL 240. The position of the OPL 240 in the leftmost image of FIG. 2 is the target location, but in practice, the OPL 240 can land well to the left or well to the right of the position shown in the leftmost image of FIG. 2.

In the central image shown in FIG. 2, a gate etch operation has been applied to etch the portions of the P-WFM 250 that is not covered by the OPL 240. In addition to removing the P-WFM 250 from the NFET side 210 of the semiconductor structure 200, portions of the P-WFM 250 under the OPL 240, a certain amount of undercutting occurs that removes some portion of the P-WFM 250 that is underneath the OPL 240, thereby creating an undercut surface 252 positioned beneath OPL 240. This placement variation, along with other pattern processing margins for fabricating the semiconductor structure 200, can exacerbate the undercut and increase the amount of the undercut. The location of the ESI region 254 over spaced-apart nanosheets 222 protects the spaced-apart nanosheet 222 from etch operations that create the undercut surface 252. Without the presence of the ESI region 234 over the spaced-apart nanosheets 222, the undercut region can be sufficiently extensive to expose portions of the topmost spaced-apart nanosheet 222, thereby exposing portions of the channel and negatively impacting the IC's performance. Because the ESI region 234 is over the spaced-apart nanosheets 222, the undercut region being extensive only exposes portions of the ESI region 234 and does not expose portions of the spaced-apart nanosheets 222, thereby enabling the P-WFM 250 between the ESI region 234 and the topmost spaced-apart nanosheet 222 to remain intact and preventing the performance of the semiconductor structure 200 from being negatively impacted by the presence of the undercut region.

In the rightmost image of FIG. 2, known semiconductor fabrication operations have been used to remove the OPL 240, deposit over the semiconductor structure 200 a gate element having an N-WFM 260, and planarize the semiconductor structure 200 to the level shown. The N-WFM 260 fills in the undercut region and interfaces with the P-WFM 250 at the undercut surface 252. The semiconductor structure 200 now forms an NFET on the NFET side 210, along with a PFET on the PFET side 220. The NFET includes spaced-apart nanosheets 212 activated by a gate element having N-WFM 260; and the PFET includes spaced-apart nanosheets 222 activated by a gate element having P-WFM 250. The NFET is separated by a fin-shaped dielectric bar 232 having the BDI region 230 and the ESI region 234. The location of the ESI region 234 over the spaced-apart nanosheets 222 electrically isolates the spaced-apart nanosheets 212 from a portion of the gate element having the N-WFM 260 that is present adjacent the P-WFM 250 and above the ESI region 234. Without the presence of the ESI region 234 over the spaced-apart nanosheets 222, the undercut region can be sufficiently extensive to allow the N-PWM 260 to extend over and contact at least a topmost one of the spaced-apart nanosheets 222, impacting the PFET's performance. Because the ESI region 234 is over the spaced-apart nanosheets 222, the undercut region being extensive only exposes portions of the ESI region 234 to the N-WFM 260 and does not expose portions of the spaced-apart nanosheets 222 to the N-WFM 260, thereby electrically isolating the spaced-apart nanosheets 222 from the N-WFM 260.

Figure 3:
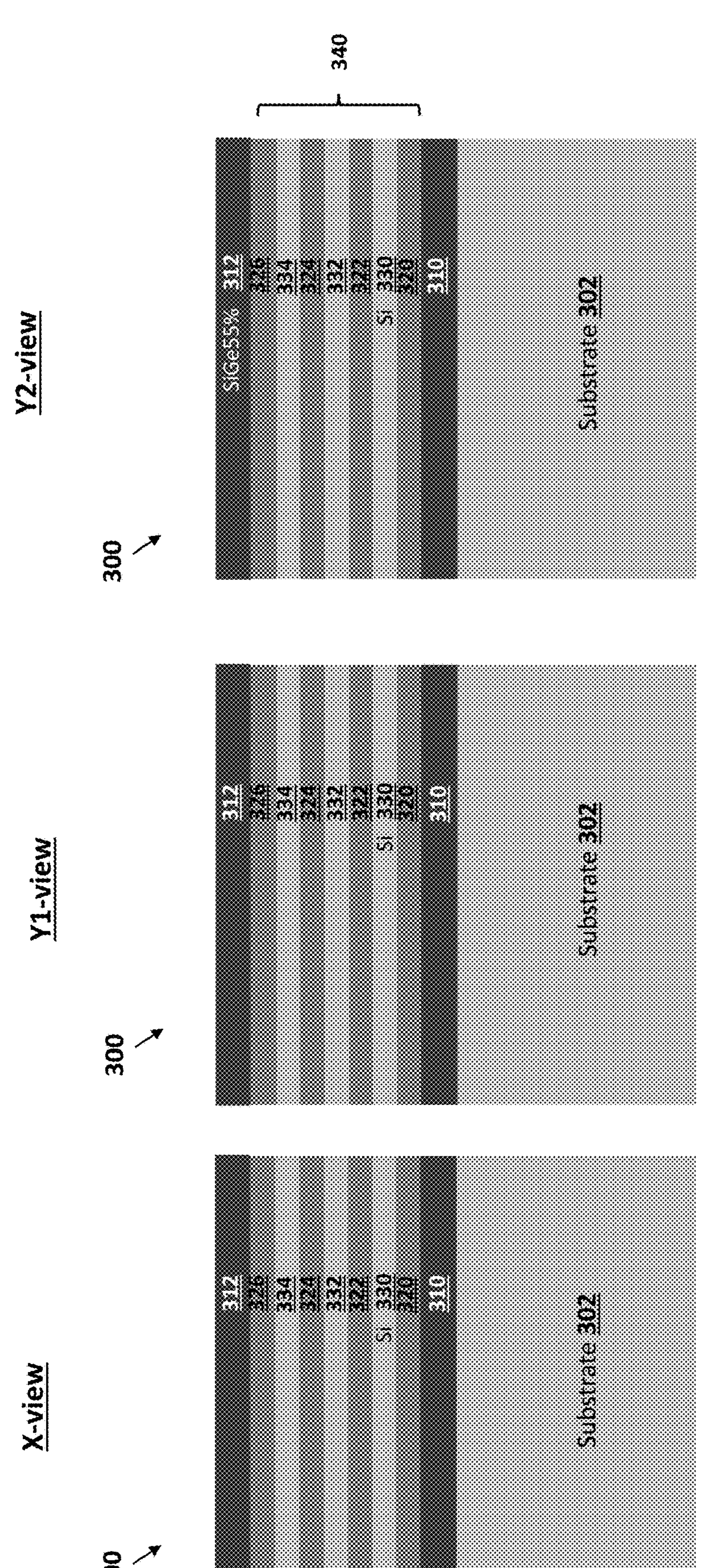

FIGS. 3-17 depict multiple cross-sectional views (i.e., an X-view, a Y1-view, and a Y2-view) of a novel fork-sheet FET after fabrication stages, which are represented by iterations of a semiconductor structure 300. Turning initially to FIG. 3, there are depicted cross-sectional views of the semiconductor structure 300 after initial fabrication operations in accordance with aspects of the present invention. As shown in FIG. 3, an initial wafer is formed that includes a substrate 302 and a nanosheet stack 340 over the substrate 302. The nanosheet stack 340 is positioned between relatively thicker SiGe sacrificial nanosheet layers 310, 312 on the bottom and top ends of the nanosheet stack 340. The nanosheet stack 340 includes alternating layers of non-sacrificial nanosheets 330, 332, 334 and sacrificial nanosheets 320, 322, 324, 326. After downstream fabrication operations are performed to remove the sacrificial nanosheets, 320, 322, 324, 326, the nanosheet stack 340 will include the non-sacrificial nanosheets, 330, 332, 334

In embodiments of the invention, the substrate 302 can be a bulk configuration. The substrate 302 can be formed from silicon or it can be formed from materials other than silicon, e.g., silicon-germanium, a III-V compound semiconductor material, and the like. The terms "substrate" or "semiconductor substrate" should be understood to cover all semiconducting materials and all forms of such materials.

In accordance with aspects of the invention, the alternating layers of non-sacrificial nanosheets 330, 332, 334 and sacrificial nanosheets 320, 322, 324, 326 are formed by epitaxially growing one nanosheet layer then the next until the desired number and desired thicknesses of the nanosheet layers are achieved. Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. A hard mask layer (not shown) is deposited over the alternating nanosheet layers 120, 122, 114, 124, 116, 126, 118, and the hard mask layer and the alternating nanosheet layers 120, 122, 114, 124, 116, 126, 118 are etched to define the hard mask (HM) 128, the nanosheet stack 130, and the sub-fin 102A of the substrate 102. The hard mask layer and the resulting HM 128 can be any suitable dielectric, including but not limited to SiN.

In embodiments of the invention, each of the non-sacrificial nanosheets 330, 332, 334 and the sacrificial nanosheets 320, 322, 324, 326 can each have a vertical direction thickness in the range from about 5 nm to about 20 nm, in the range from about 10 nm to about 15 nm, or about 10 nm. Other vertical direction thicknesses are contemplated. Although seven (7) alternating layers of non-sacrificial nanosheets 330, 332, 334 and sacrificial nanosheets 320, 322, 324, 326 are depicted in the figures, any number of alternating layers can be provided.

In some embodiments of the invention, the non-sacrificial nanosheet layers 330, 332, 334 can be Si. In some embodiments of the invention, the sacrificial nanosheet layers 320, 322, 324, 326 can be about SiGe 30%. The notation "SiGe 20%" is used to indicate that 20 at % of the SiGe material is Ge and 80 at % of the SiGe material is Si. In some embodiments of the invention, the Ge percentage in the SiGe implementations of the sacrificial nanosheet layers 320, 322, 324, 326 can be any value, including, for example a value within the range from about 20% to about 45%.

In embodiments of the invention, the relatively thicker SiGe sacrificial nanosheet layers 310, 312 each has a Ge percentage that is sufficiently greater than the Ge percentage in the SiGe sacrificial nanosheet layers 320, 322, 324, 326 to provide etch selectivity between the relatively thicker sacrificial nanosheet layers 310, 312 and the remaining portions of the stacked nanosheet-based structure 300, including specifically the SiGe sacrificial nanosheet layers 320, 322, 324, 326. In some aspects of the invention, the Ge percentage in the relatively thicker SiGe sacrificial nanosheet layers 310, 312 is at a value within the range from about 50% to about 65%. In some aspects of the invention, the sacrificial nanosheet layers 320, 322, 324, 326 can be SiGe 30%, and the relatively thicker SiGe sacrificial nanosheet layers 310, 312 can be at or above about SiGe 55%.

Figure 4:
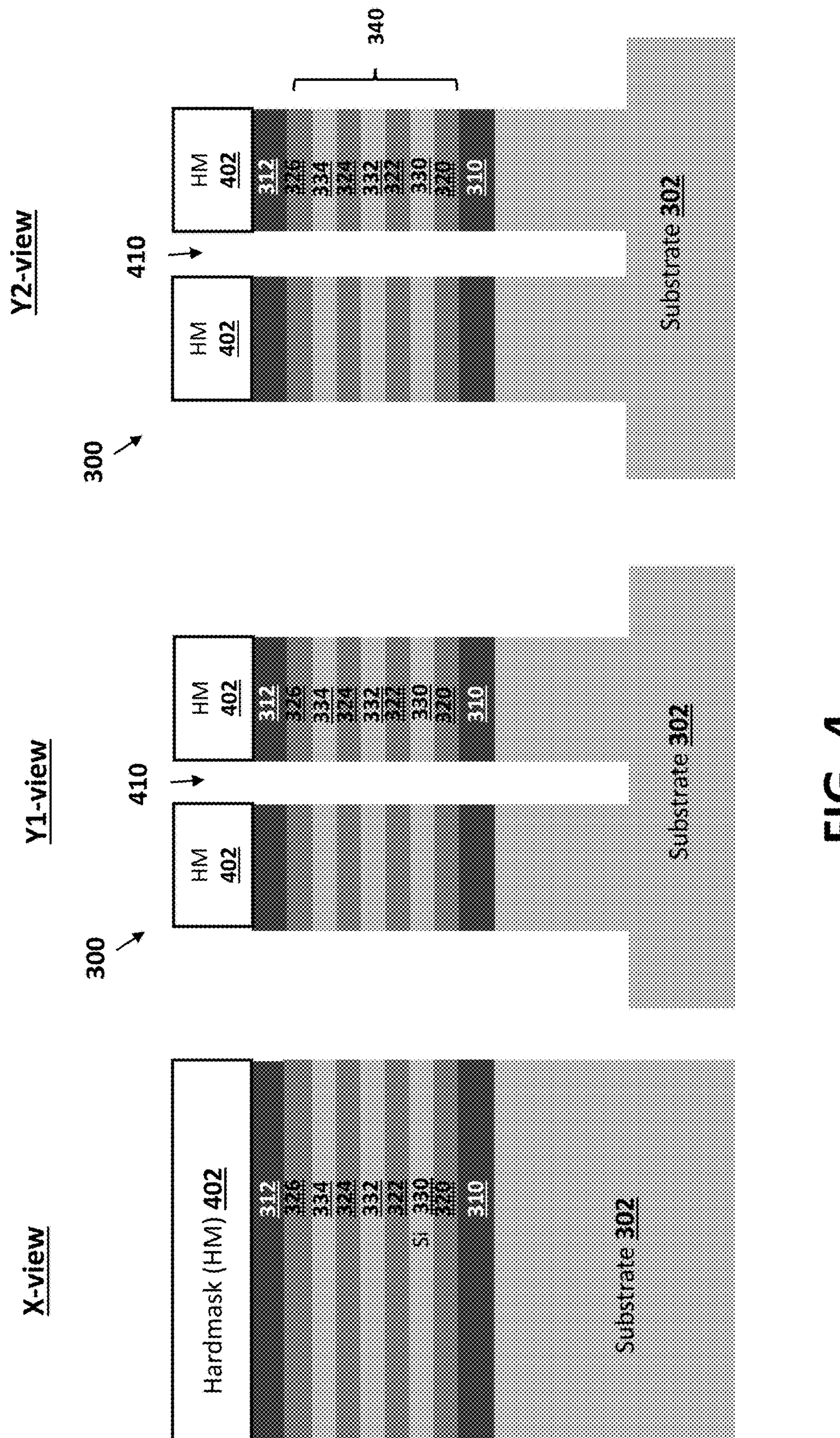

FIG. 4 depicts cross-sectional views of the semiconductor structure 300 after known fabrication operations have been used to form a hard mask (HM) 402. A HM layer (not shown) was deposited over the semiconductor structure 300. The HM layer was patterned and etched. The semiconductor structure 300 was then etched to define elongated fin-shapes for a dielectric bar trench 410; the relatively thicker nanosheets 310, 312; the nanosheet stack 340; and a portion of the substrate 302. The HM layer and the resulting HM 402 can be any suitable dielectric, including but not limited to SiN.

Figure 5:
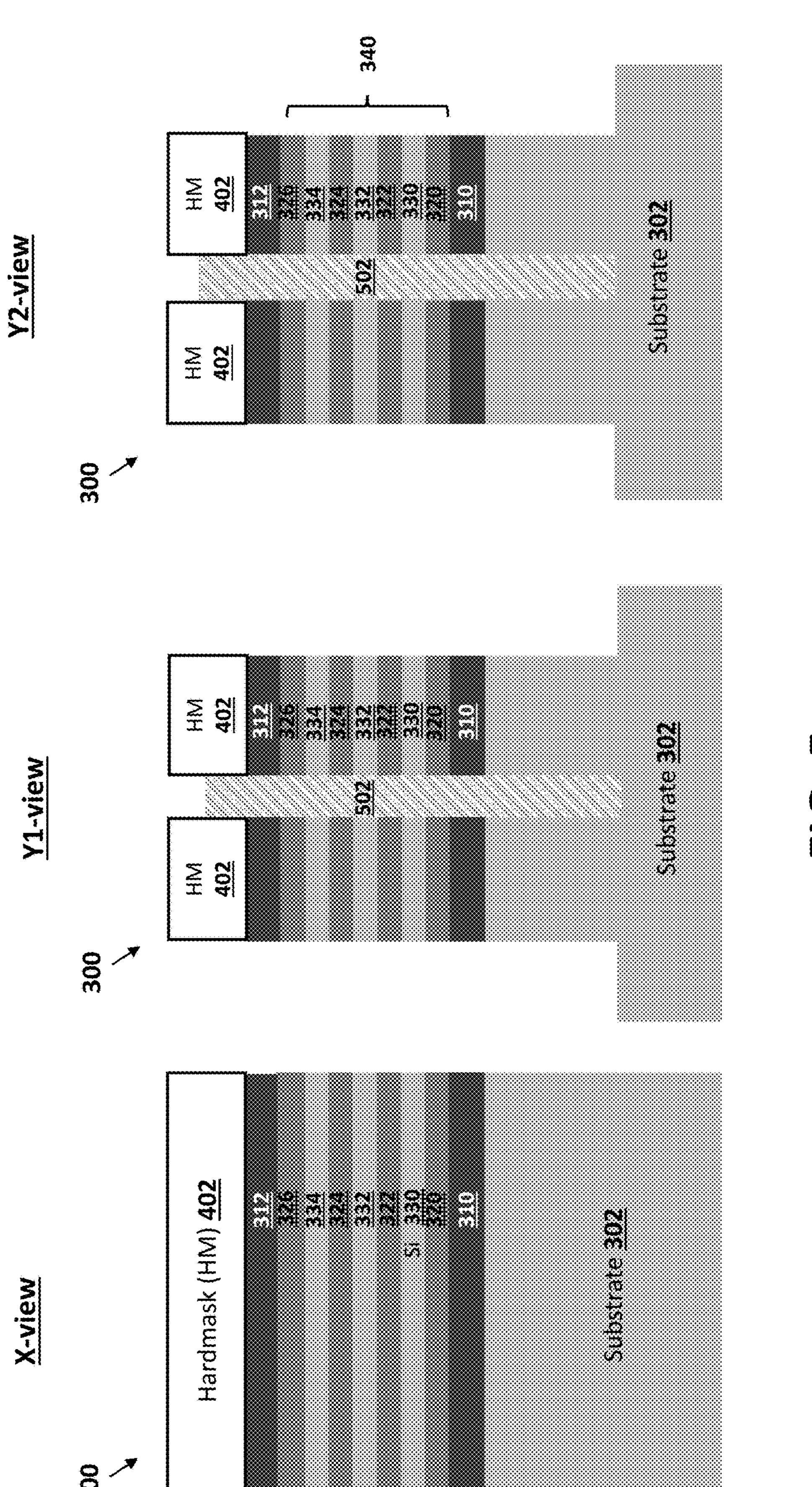

FIG. 5 depicts cross-sectional views of the semiconductor structure 300 after known fabrication operations have been applied according to embodiments of the invention. A layer of dielectric isolation material is deposited everywhere on the semiconductor structure 300 including filling the dielectric bar trench 410 (shown in FIG. 4). The dielectric isolation material provides dielectric isolation between an NFET region (e.g., NFET side 210 shown in FIG. 2) and a PFET region (e.g., PFET side 220 shown in FIG. 2) of the semiconductor structure 300. The dielectric isolation material can be deposited using ALD, CVD, or any other suitable deposition technique. Example materials of the dielectric isolation material can include silicon carbide (SiC), silicon carbon oxygen (SiCO), SiOCN, SiBCN, and the like. Any excess dielectric isolation material can be removed by a suitable selective isotropic etching process.

Figure 6:
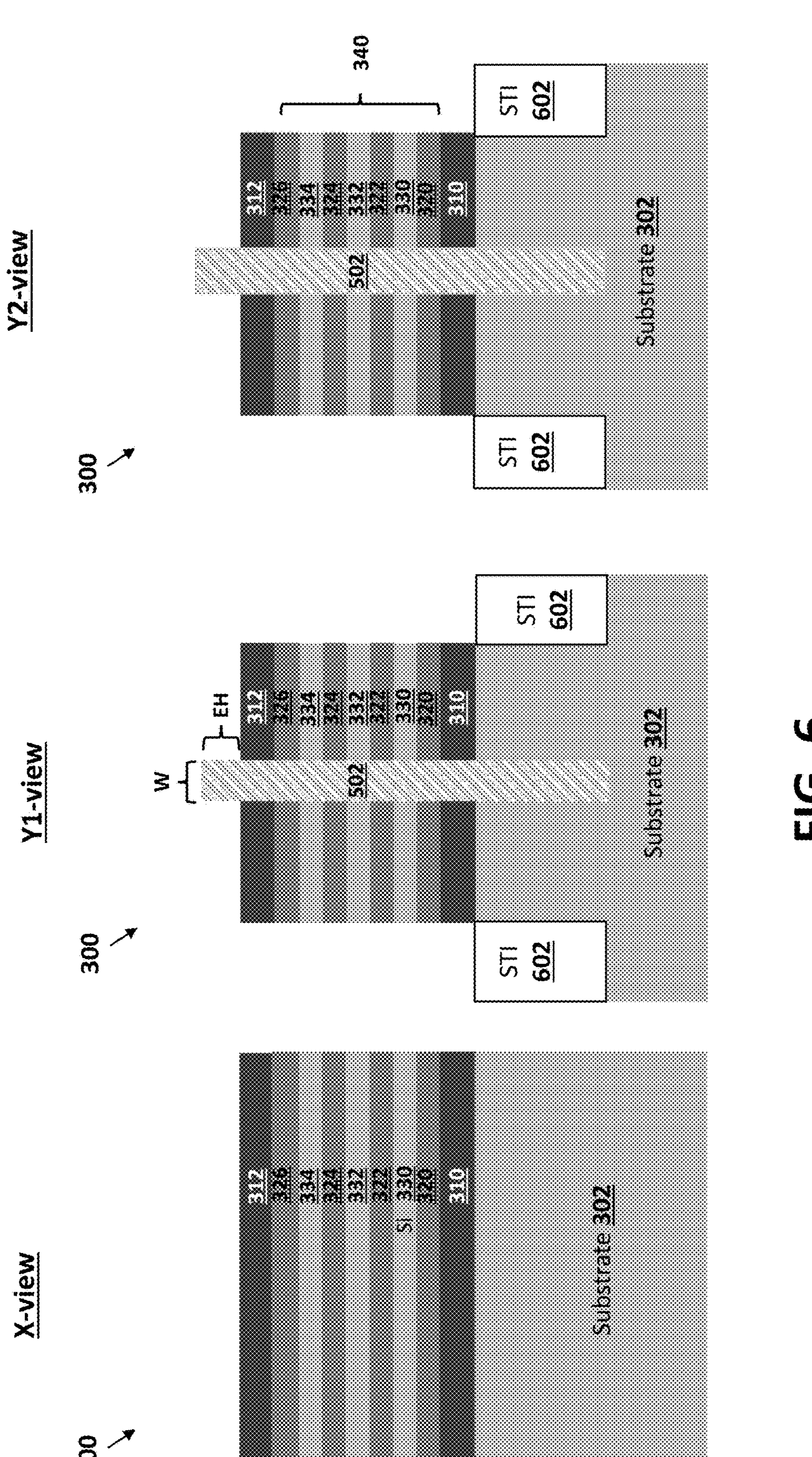

FIG. 6 depicts cross-sectional views of the semiconductor structure 300 after known fabrication operations have been used to remove the HM 402 and deposit a dielectric material (not shown) over the semiconductor structure 300. The dielectric material is planarized or recesses to form shallow trench isolation (STI) regions 602, which prevent electrical current from leaking between adjacent semiconductor device components of the substrate 302. The STI regions 602 can include any suitable dielectric material, such as, for example, an oxide (e.g., $SiO_2$).

As depicted in FIG. 6, the dielectric bar 502 is a high aspect ratio fin-shaped structure that is supported on all sides other than a relatively small segment of the dielectric bar 502 that extends slightly above the topmost relatively thicker sacrificial layer 312. As previously noted herein, the fork-sheet FETs that will be formed from the semiconductor structure 300 enable tighter N2P spacing and reductions in area scaling. Such fork-sheet FET can achieve, for example, a 42 nm CPP, along with a 16 nm metal pitch. Thus, to achieve this N2P spacing benefits, only a relatively small width dimension W can be allocated to the dielectric bar 502. In embodiments of the invention, the dielectric bar 502 has a narrow width W ranging from about 6 nm to about 50 nm thick. Because the dielectric bar 502 has a necessarily narrow width dimension W, it is has relatively low structural integrity when it is not being supported. Thus, it is difficult to fabricate the dielectric bar 502 having the width dimension W and extending beyond the extension height (EH) shown in FIG. 6 without complicating the device fabrication operations and/or compromising other beneficial features (e.g., N2P spacing; gate height; and the like) of the forksheet architecture of the semiconductor structure 300. In embodiments of the invention, the dielectric bar 502 has an EH dimension ranging from about 3 nm to about 50 nm.

FIG. 7 depicts cross-sectional views of the semiconductor structure 300 after known fabrication operations have been used to form sacrificial gates 702, configured and arranged as shown. Prior to formation of the sacrificial gates 702, a thin layer of gate oxide (not shown separately) is deposited the semiconductor structure 300. The sacrificial gates 702 represent the combination of the thin layer of gate oxide (e.g., $SiO_2$) and a material (e.g., amorphous silicon (a-Si)) from which the sacrificial gates 702 are formed. The sacrificial gates 702 can be formed by depositing a sacrificial gate material (not shown) over the gate oxide. A HM layer (not shown) is deposited over the sacrificial gate material, patterned, and etched to form the HMs 704 and the sacrificial gates 702. In some embodiments of the invention, the sacrificial gate material can be polycrystalline Si. In some embodiments of the invention, the sacrificial gate material can be amorphous Si (a-Si).

FIG. 8 depicts cross-sectional views of the semiconductor structure 300 after known fabrication operations (e.g., a selective etch) have been used to selectively remove the relatively thicker and higher Ge percentage SiGe sacrificial nanosheets 310, 312 (shown in FIG. 7), thereby forming cavities 810, 820. An isotropic etch can be performed that is selective to remove the relatively thicker and higher Ge percentage SiGe sacrificial nanosheets 310, 312 while not removing the remaining portions of the semiconductor structure 300, including specifically the SiGe sacrificial nanosheets 320, 322, 324, 326 having a significantly lower Ge percentage than the relatively thicker and higher Ge percentage SiGe sacrificial nanosheets 310, 312. An example etchant that selectively etches the relatively thicker and higher Ge percentage SiGe sacrificial nanosheets 310, 312 can include a vapor phase hydrogen chloride (HCl) at a suitable temperature and pressure.

FIG. 9 depicts cross-sectional views of the semiconductor structure 300 after known fabrication operations have been used to deposit dielectric material that forms multiple dielectric regions, including a BDI region 910, an ESI region 920, and offset gate spacers 930 in open spaces of the semiconductor structure 300, including, for example, the cavities 810, 820. The BDI region 910 provides dielectric isolation between the nanosheet stack 340 and the substrate 302. The ESI region 920, in accordance with aspects of the invention, will provide both etch-stop and electric isolation for the nanosheet stack 340, and more specifically for the topmost spaced-apart non-sacrificial nanosheet 334. The offset gate spacers 930 on sidewalls of the sacrificial gates 702 define the part of the gate region where the final gate structure (e.g., N-WFM 1602 and P-WFM 1302 shown in FIG. 17) will be formed when the sacrificial gate 702 is replaced with the final gate structure. In embodiments of the invention, the multiple dielectric regions 910, 920, 930 can be any suitable dielectric material, including, for example, silicon oxide, silicon nitride, silicon oxynitride, SiBCN, SiOCN, SiOC, or any suitable combination of those materials. In some embodiments of the invention, the offset gate spacers 930 can be a low-k dielectric material . . . . The dielectric material used to form the BDI region 910, the ESI region 920, and the offset gate spacers 930 can be deposited using ALD, CVD, or any other suitable deposition technique. Example materials of the dielectric material can include silicon carbide (SiC), silicon carbon oxygen (SiCO), SiOCN, SiBCN, and the like. Any excess deposited dielectric material can be removed by a suitable selective isotropic etching process.

Figure 10:
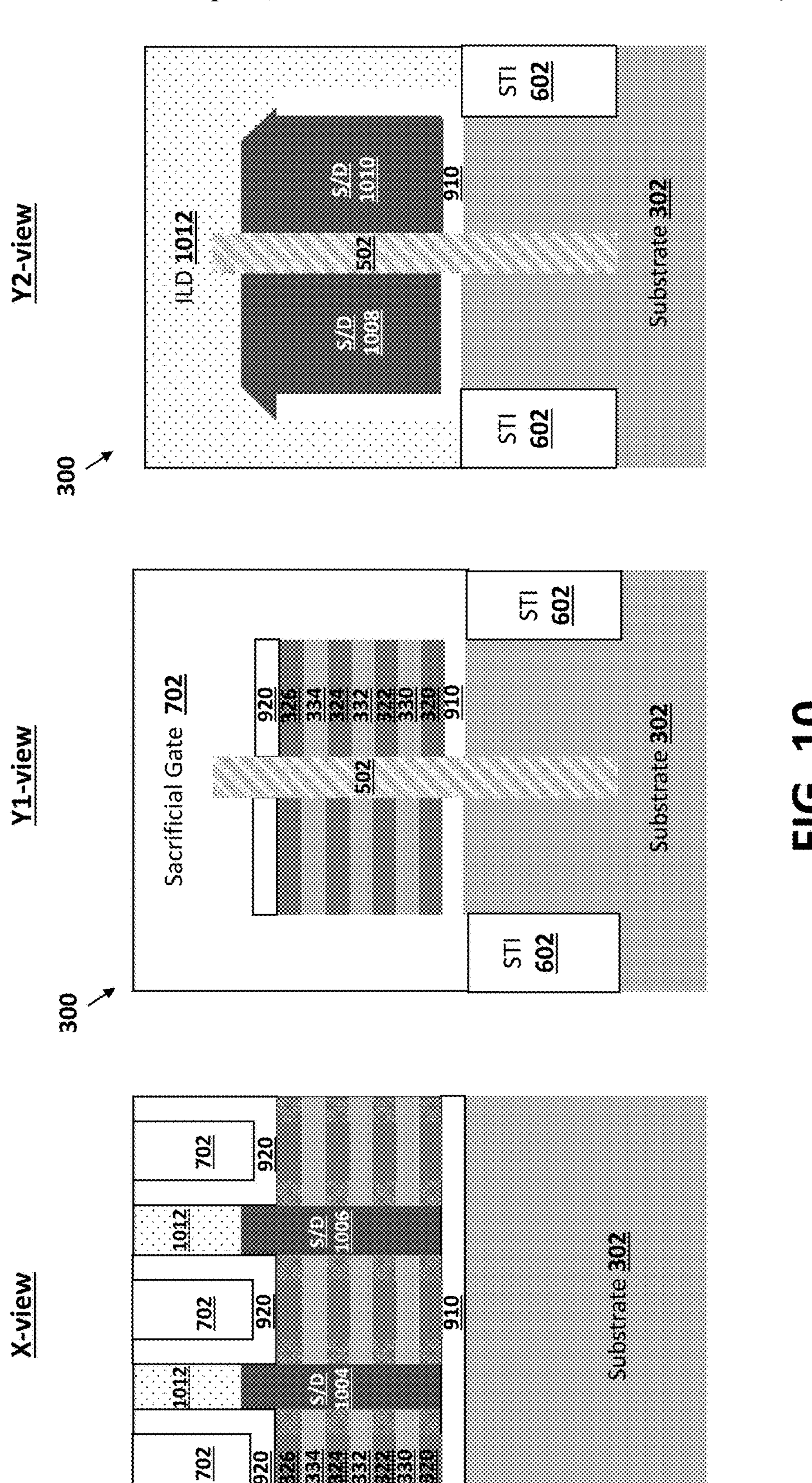

FIG. 10 depicts cross-sectional views of the semiconductor structure 300 after known fabrication operations have been applied in accordance with embodiments of the invention. Initially, and as best shown in the X-view, the portions of the nanosheet stack 340 that are not covered by the offset gate spacers 930 and the sacrificial gates 702 are etched, thereby forming trenches that each extends through the nanosheet stack 340. The trenches provide access to end regions of the sacrificial nanosheets 320, 322, 324, 326. In the X-view of FIG. 10, the right-most and left-most instances of the sacrificial gates 702 can each be associated with an active or inactive electronic device (e.g., a transistor) depending on the requirements of the IC design in which the semiconductor structure 300 will be incorporated. Where the right-most and/or left-most instances of the sacrificial gates 702 are part of an active transistor, the active transistor formed from right-most and/or left-most side will be in series with the transistor associated with the center instance of the sacrificial gate 702 and will share a to-be-formed doped source or drain (S/D) drain region with the transistor associated with the center instances of the sacrificial gate 702. Whether or not the transistors associated with the right-most and left-most instances of the sacrificial gates 702 are active, the right-most and left-most instances of the sacrificial gate 702 and the gate spacers 930 define portions of the previously described trenches in which the doped S/D regions 1004, 1006 and the interlayer dielectric (ILD) regions 1012 will be formed.

Referring still to FIG. 10, subsequent to forming the above-described trenches, but prior to forming the p-type doped S/D regions 1004, 1006, known semiconductor fabrication processes are used to partially remove end regions of the SiGe sacrificial nanosheets 320, 322, 324, 326 to form end region or inner spacer cavities in which the inner spacers 1002 are formed. The inner spacers 1002 can be silicon nitride, silicoboron carbonitride, silicon carbonitride, silicon carbon oxynitride, or any other type of dielectric material (e.g., a dielectric material having a dielectric constant k of less than about 5). Subsequent to forming the inner spacers 1002, known fabrication operations are used to form the doped S/D regions 1004, 1006 in the previously-described trenches. In embodiments of the invention, an epitaxial growth process can be used to grow the doped S/D regions 1004, 1006 from exposed ends of the Si non-sacrificial nanosheets 330, 332, 334. In embodiments of the invention, the doped S/D regions 1004, 1006 can be epitaxially grown from gaseous or liquid precursors using, for example, vapor-phase epitaxy (VPE), molecular-beam epitaxy (MBE), liquid-phase epitaxy (LPE), or other suitable process. In embodiments of the invention, the doped S/D regions 1004, 1006 can be doped during deposition (e.g., in-situ doped) by adding dopants during the above-described methods of forming the doped S/D regions 1004, 1006. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). As best shown in the Y2-view, the S/D regions on one side of the dielectric bar 502 will be doped n-type, and the SD regions on the opposite side of the dielectric bar 502 will be doped p-type.

Referring still to FIG. 10, subsequent to forming the doped S/D regions 1004, 1006, known semiconductor device fabrication processes are used to deposit ILD regions 1012 to fill in remaining open spaces of the semiconductor structure 300. In aspects of the invention, the ILD regions 1012 can be formed from a low-k dielectric (e.g., k less than about 4) and/or an ultra-low-k (ULK) dielectric (e.g., k less than about 2.5). The nanosheet-based structure 300 is then planarized to a predetermined level to remove the HMs 704 and prepare the semiconductor structure 300 for downstream processing.

Figure 11:
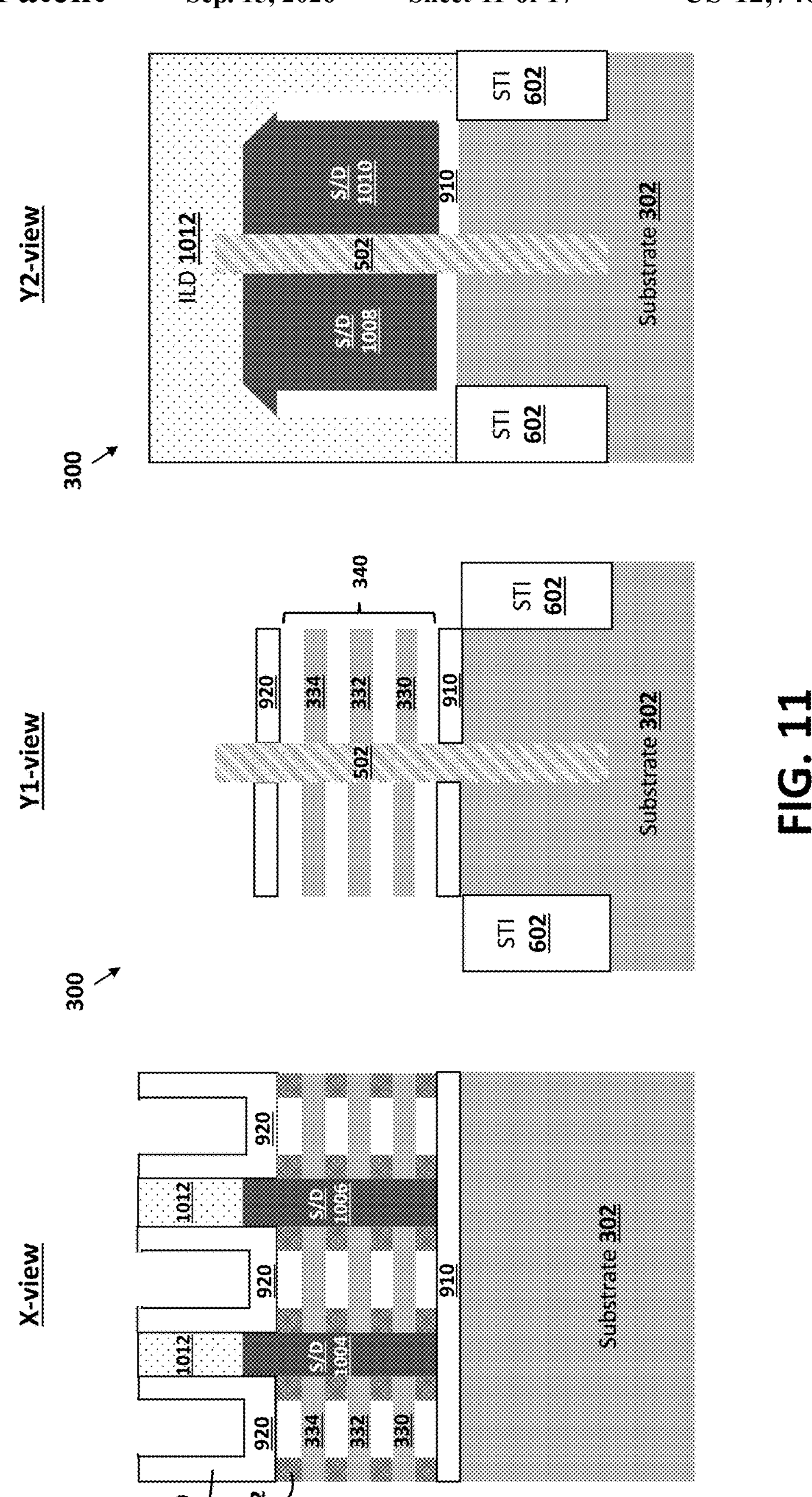

FIG. 11 depicts cross-sectional views of the semiconductor structure 300 after known fabrication operations have been applied according to embodiments of the invention. More specifically, known semiconductor fabrication operations have been used to remove the SiGe sacrificial nanosheets 320, 322, 324, 326 (shown in FIG. 10) and the sacrificial gates 702 (shown in FIG. 10). The sacrificial gates 702 and the gate dielectric (not shown) can be removed by suitable known etching processes, e.g., RIE or wet removal processes. Known semiconductor fabrication operations can be used to remove the SiGe sacrificial nanosheets 320, 322, 324, 326 selective to the Si non-sacrificial nanosheets 330, 332, 334. In embodiments of the invention, because the SiGe sacrificial nanosheets 320, 322, 324, 326 are formed from SiGe, they can be selectively etched with respect to the Si non-sacrificial nanosheets 330, 332, 334 using, for example, a vapor phase HCL gas isotropic etch process. After the fabrication operations depicted in FIG. 11, the nanosheet stack 340 (shown in FIG. 9) no longer includes the SiGe sacrificial nanosheets 320, 322, 324, 326.

Figure 12:
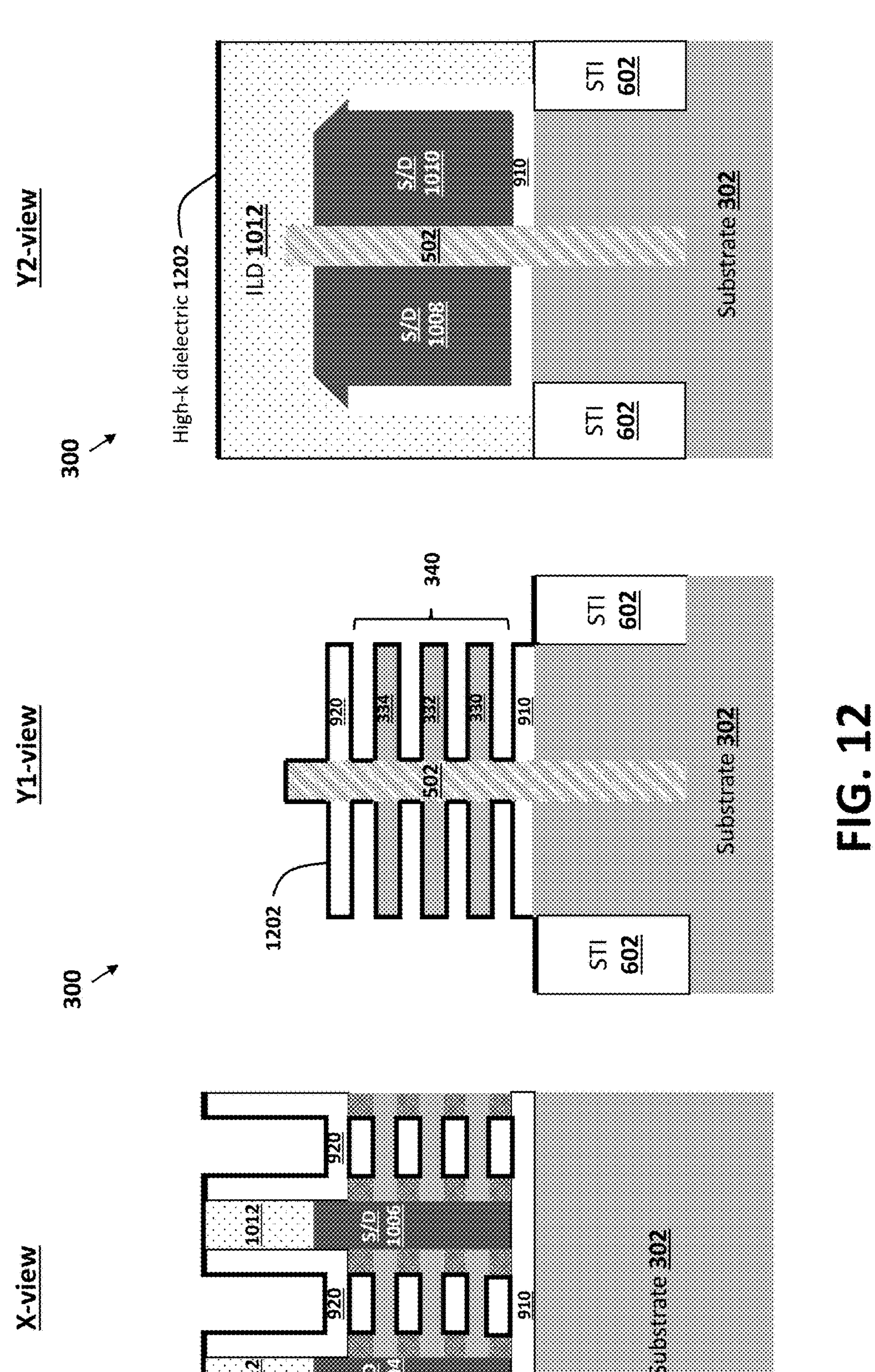
Figure 13:
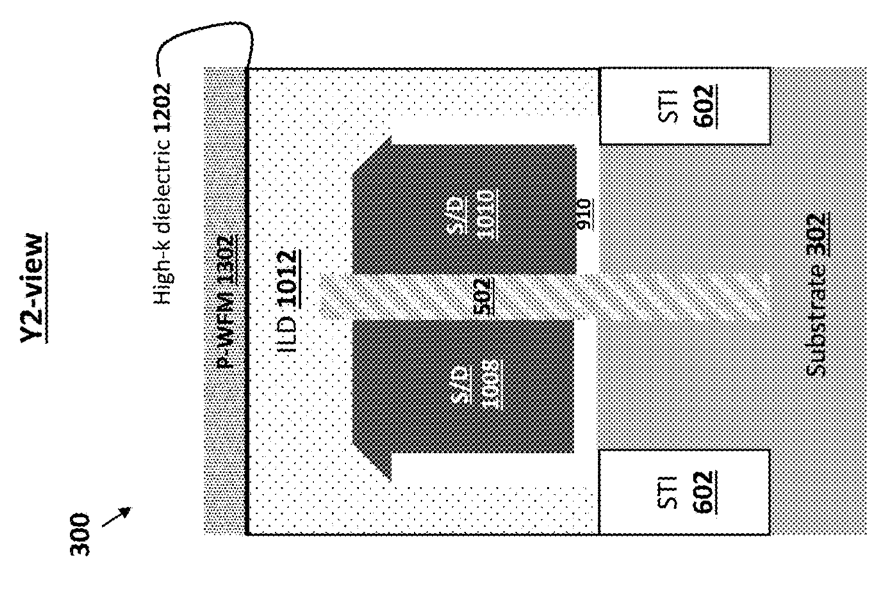
Figure 13:
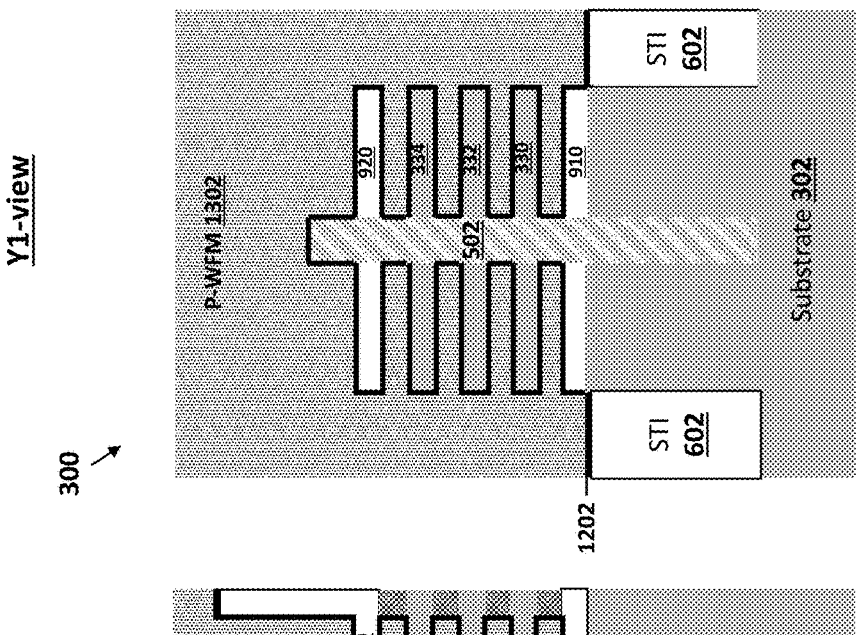
Figure 13:
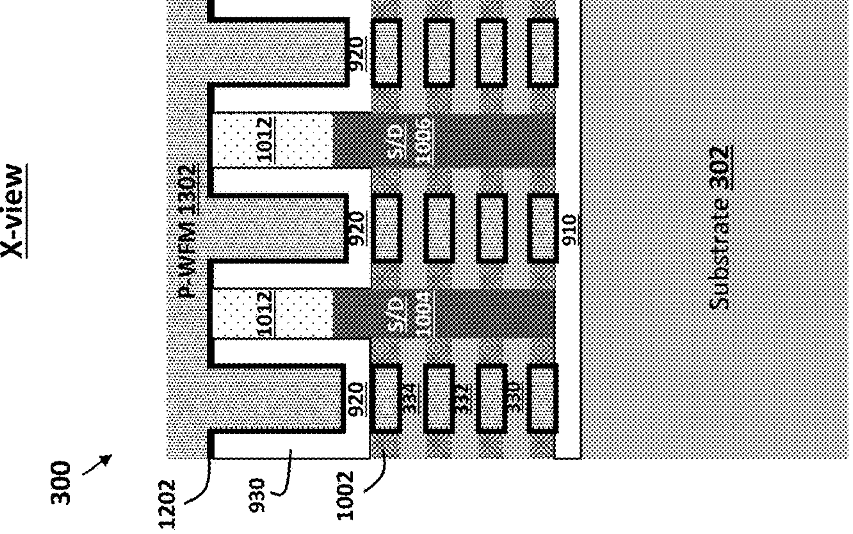

FIG. 12 depicts cross-sectional views of the semiconductor structure 300 after known fabrication operations have been used to deposit a high-k dielectric layer 1202 in spaces that were occupied by the SiGe sacrificial nanosheets 320, 322, 324, 326 (shown in FIG. 10) and the sacrificial gates 702 (shown in FIG. 10). FIG. 13 depicts cross-sectional views of the semiconductor structure 300 after known fabrication operations have been used to fill the remaining spaces that were occupied by the SiGe sacrificial nanosheets 320, 322, 324, 326 and the sacrificial gates 702 with a gate metal material having a p-type work function metal (P-WFM) 1302. Together, the high-k dielectric layer 1202 and the gate material form a high-k metal gate (HKMG) 1202/1302. As best shown in the Y1-view, the portion of the HKMG 1202/1302 to the right of the dielectric bar 502 is considered non-sacrificial, and the portion of the HKMG 1202/1302 to the left of the dielectric bar 502 is considered sacrificial and will be replaced in subsequent fabrication operations in accordance with aspects of the invention to provide a gate metal material having an n-type work function metal (N-WFM) 1602 (shown in FIG. 16).

Figure 14:
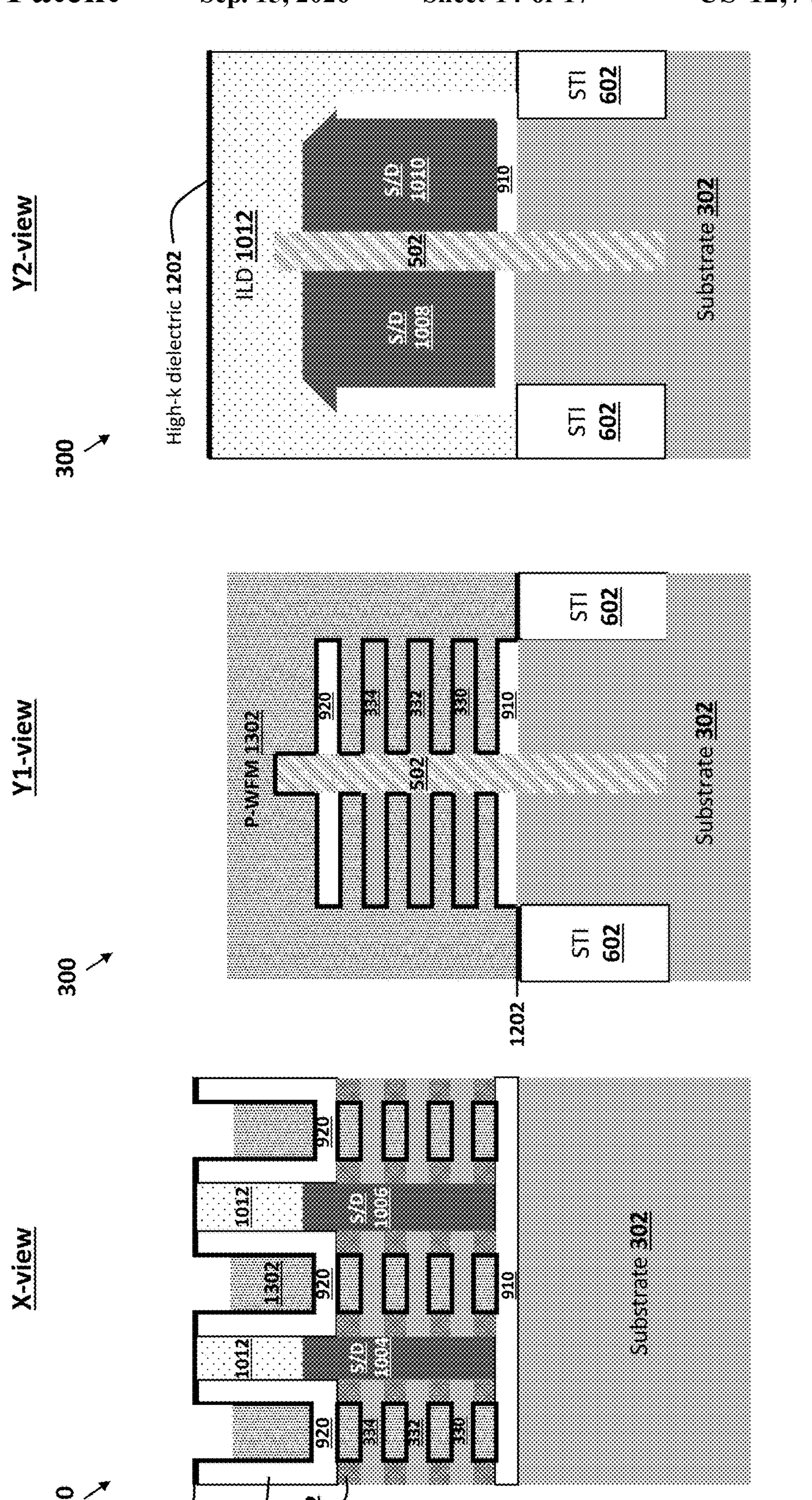
Figure 15:
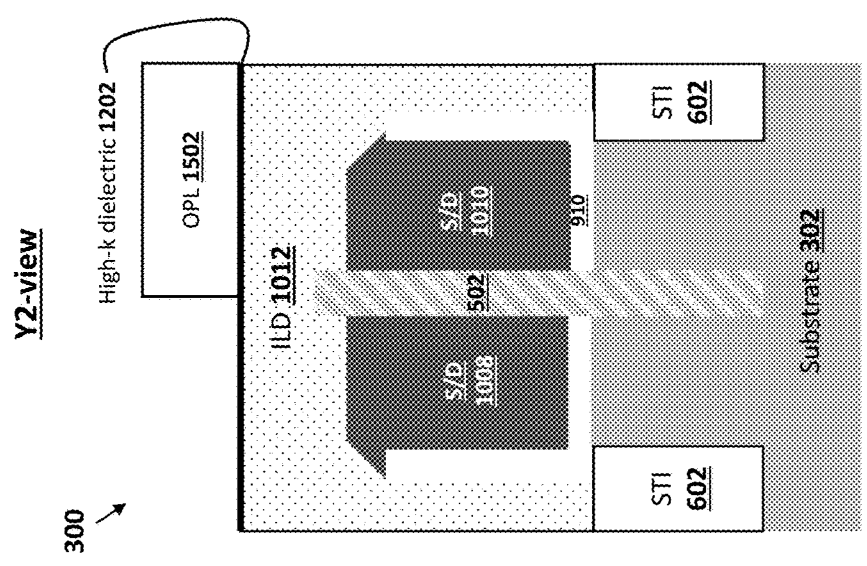
Figure 15:
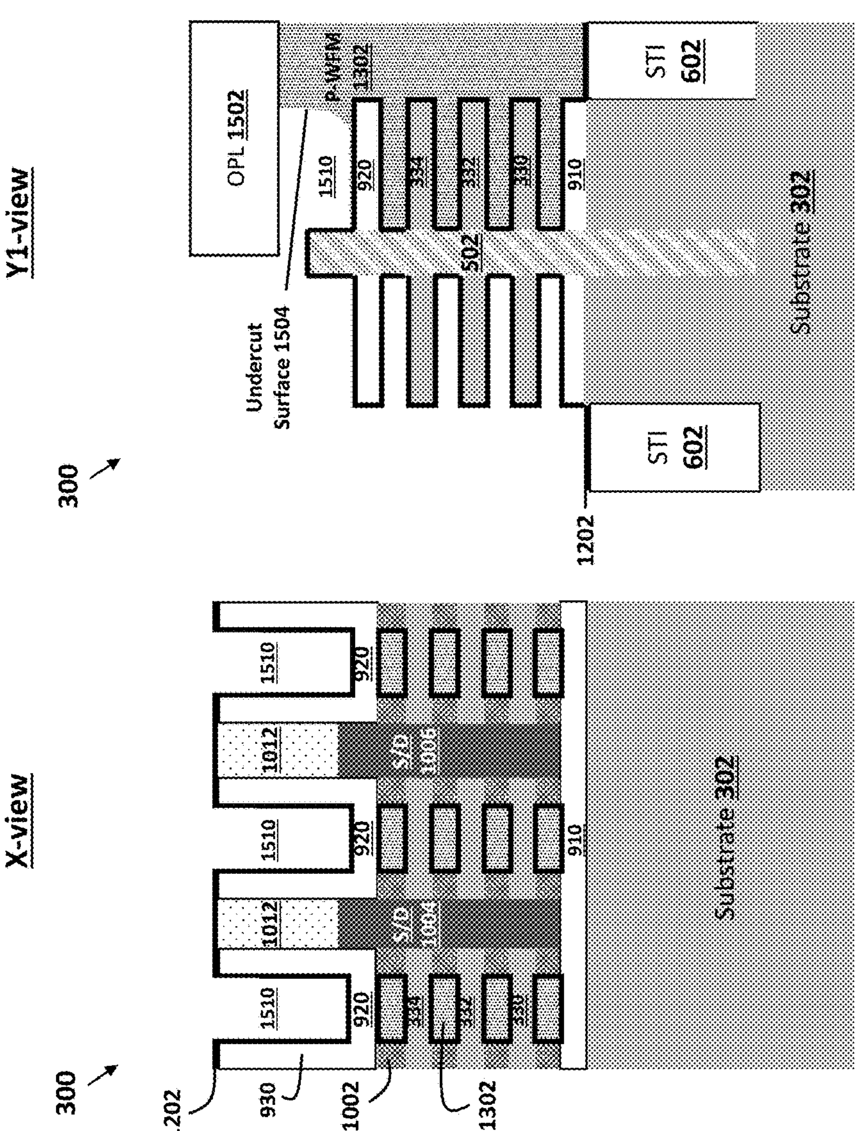

FIG. 14 depicts cross-sectional views of the semiconductor structure 300 after known fabrication operations have been used to recess the P-WFM 1302 to the levels shown. FIG. 15 depicts cross-sectional views of the semiconductor structure 300 after known fabrication operations have been used to deposit a blocking element over the portion of the semiconductor structure 300 that is positioned to cover the right side of the dielectric bar 502. In embodiments of the invention, the blocking element can be an OPL 1502. In general, OPLs are used as etch masks for pattern transfers into inorganic substrates, to fill pre-existing features, and to planarize a substrate to allow for larger patterning process windows. As previously noted herein, although the relatively close N2P spacing of fork-sheet FETs provides benefits, close N2P spacing also results in correspondingly smaller patterning process margins when fabricating a fork-sheet FET. As a result of the smaller dimensions of the semiconductor structure 300, there can be a large variation in the fabrication processes used to place the OPL 1502. The position of the OPL 1502 in the Y1-view is the target location, but in practice, the OPL 1502 can land well to the left or well to the right of the position shown in the Y1-view of FIG. 15.

As best seen in the Y1-view of FIG. 15, a gate etch operation has been applied to etch the portions of the P-WFM 1302 that are not covered by the OPL 1502. In addition to removing the P-WFM 1302 from the uncovered side of the semiconductor structure 300 portions of the P-WFM 1302 under the OPL 1502, a certain amount of undercutting occurs that removes some portion of the P-WFM 1302 that is underneath the OPL 1502, thereby creating an undercut surface 1504 and an undercut region 1510 positioned beneath the OPL 1502. The placement variations of the OPL 1502 during fabrication, along with other pattern processing margins for fabricating the semiconductor structure 300, can exacerbate the undercut and increase the amount of the undercut region 1510, for example, where the OPL 1502 is positioned to the right of the dielectric bar 502. The location of the ESI region 920 over the non-sacrificial nanosheets 330, 332, 334 protects the non-sacrificial nanosheets 330, 332, 334 and particularly the topmost non-sacrificial nanosheet 334 from etch operations that create the undercut surface 1504 and the undercut region 1510, regardless of the degree of misplacement of the OPL 1502 from its target location. Without the presence of the ESI region 920 over the non-sacrificial nanosheets 330, 332, 334, the undercut region 1510 can be sufficiently extensive to expose portions of the topmost non-sacrificial nanosheet 334, thereby exposing portions of the non-sacrificial nanosheet 334 (i.e., the device channel) and negatively impacting the IC's performance. Because the ESI region 920 is over the non-sacrificial nanosheets 330, 332, 334, the undercut region 1510 being extensive only exposes portions of the ESI region 920 and does not expose portions of the non-sacrificial nanosheets 330, 332, 334, thereby enabling the P-WFM 1302 between the ESI region 920 and the topmost non-sacrificial nanosheet 334 to remain intact and preventing the performance of the semiconductor structure 300 from being negatively impacted by the presence of the undercut region 1510.

Figure 16:
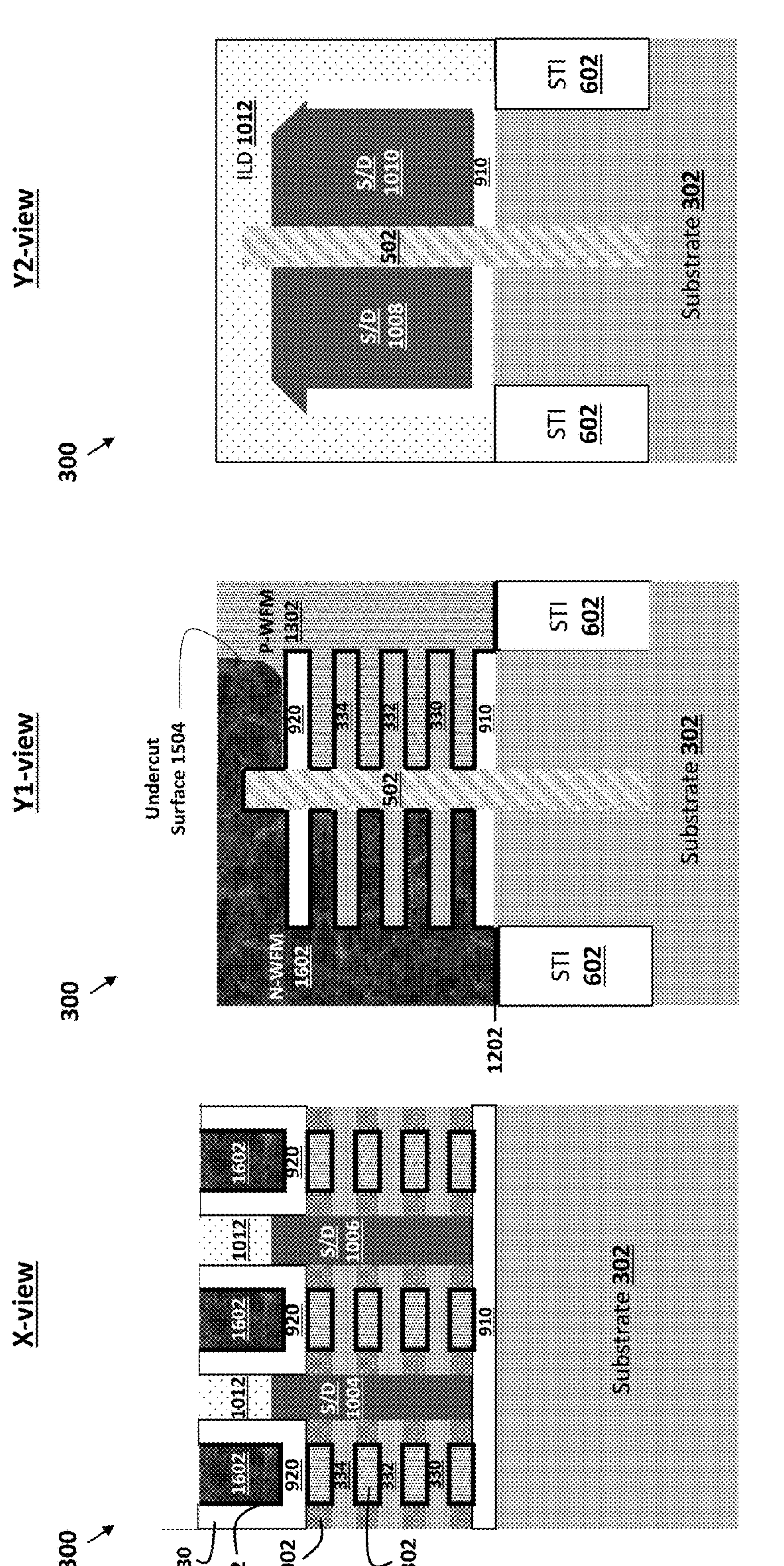

As best seen in the Y1-view of FIG. 16, known semiconductor fabrication operations have been used to remove the OPL 1502, deposit over the semiconductor structure 300 a gate element having an N-WFM 1602, and planarize the semiconductor structure 300 to the level shown. The N-WFM 1602 fills in the spaces that were occupied by the removed sections of the P-WFM 1302, including the undercut region 1510 (shown in FIG. 15). Thus, The N-WFM 1602 interfaces with the P-WFM 1302 at the undercut surface 1504. As best shown by the Y1-view of FIG. 16, the semiconductor structure 300 now forms an NFET (i.e., an n-type fork-sheet FET) to the left side of the dielectric bar 502, along with forming a PFET (i.e., a p-type fork-sheet FET) on the right side of the dielectric bar 502. The NFET includes the non-sacrificial nanosheets 330, 332, 334 activated by a gate element having the N-WFM 1602; and the PFET includes the non-sacrificial nanosheets 330, 332, 334 activated by a gate element having the P-WFM 1302.

Figure 17:
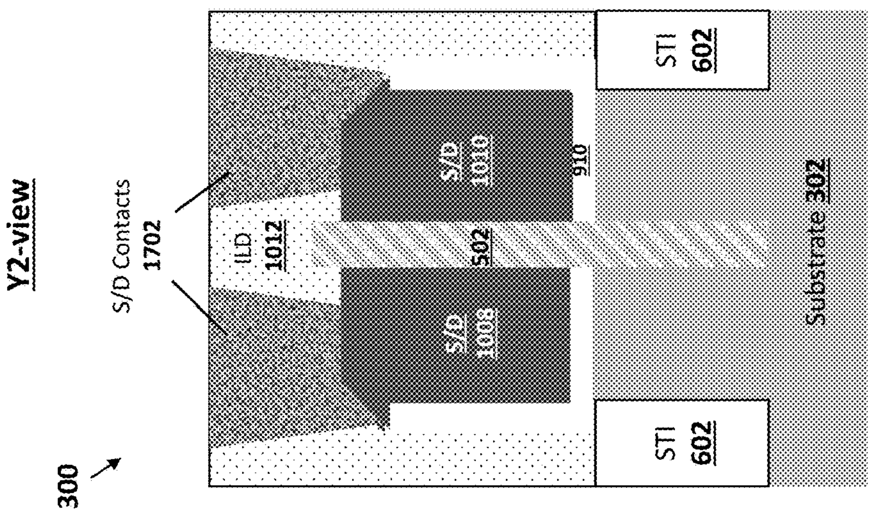
Figure 17:
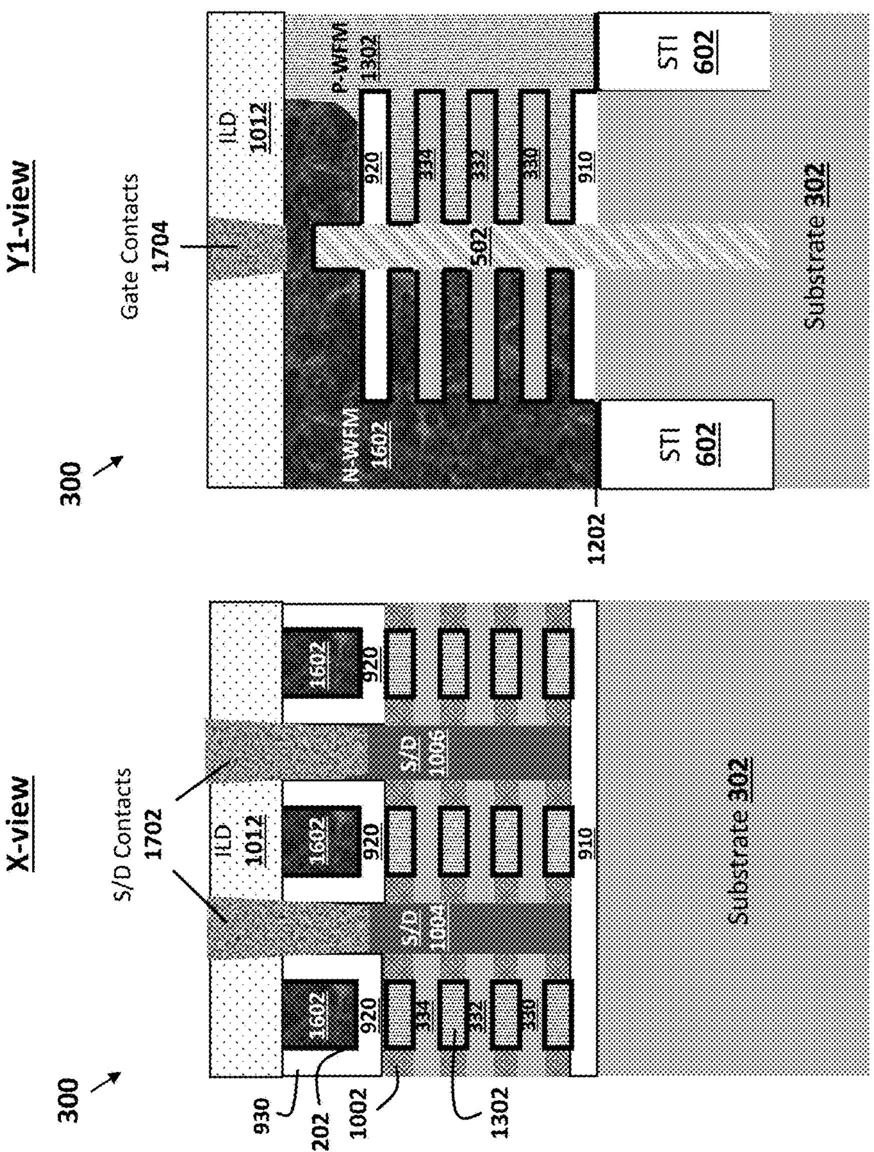

In FIG. 17, subsequent to the fabrication operations depicted in FIG. 16, known semiconductor operations have been used to deposit an additional layer of the ILD 1012 over the semiconductor structure 300. Subsequently, known semiconductor fabrication operations are used to form S/D contact trenches extending through the ILD 1012 that expose top surfaces of the S/D regions 1004, 1006, 1008, 1010. S/D contacts 1702 shown in the X-view and the Y2-view of FIG. 17 are formed in the S/D contact trenches. Similarly, known semiconductor fabrication operations are used to form a gate contact trench extending through the ILD 1012 to expose a top surface of the gate element that includes the N-WFM 1602. A gate contact 1704 shown in the Y1-view of FIG. 17 is formed in the gate contact trench. Although not shown, a gate contact trench and gate contact are also form for the gate element that includes the P-WFM 1302. In some embodiments of the invention the S/D contacts 1702 and the gate contacts 1704 include contact isolation liners that interface with sidewalls of the respective trenches. The contact isolation liners can include a dielectric material (e.g., $SiO_2$, high K, SiN). In some embodiments of the invention, the S/D contacts 1702 and the gate contacts 1704 can be formed from conductive material (e.g., a trench silicide) and deposited using, for example, a chemical/electroplating process.

Accordingly, it can be seen from the foregoing detailed description that embodiments of the invention provide technical benefits and technical effects. Embodiments of the invention provide fabrication methods and resulting structures for a fork-sheet (or integrated) transistor having an over-the-channel etch-stop and isolation region. In embodiments of the invention, the over-the-channel etch-stop and isolation region can be implemented as an etch-stop isolation (ESI) region. In embodiments of the invention, the fork-sheet FET includes an NFET segment integrated with a PFET segment. The PFET segment includes a first channel and, and the NFET segment includes a second channel. The first channel includes a first nanosheet stack; and the second channel that includes a second nanosheet stack separated from the first nanosheet stack by a first isolation region. A second isolation region includes the ESI region positioned over the first nanosheet stack. A first type of gate element (e.g., a gate element having a p-type FET WFM) is provided in the PFET segment, and a second type of gate element (e.g., a gate element having an n-type FET WFM) is provided in the NFET segment. A portion of the first type of gate element is between the ESI region and the nanosheet stack; and the second type of gate element over and around the second nanosheet stack. The ESI region is operable to prevent etching the portion of the first type of gate element that is between the ESI region and the first nanosheet stack.

The above-described embodiments of the invention provide technical benefits and technical effects. For example, the location of the ESI region over the nanosheet stack protects the nanosheet stack from etch operations applied to the first type of gate element during fabrication of the IC. More specifically, in some embodiments of the invention, the fabrication operations used to form the first type of gate element includes applying a gate etch operation to the first type of gate element, which can result in the first type of gate element being undercut. Without the presence of the ESI region over the nanosheet stack, the undercut region can be sufficiently extensive to expose portions of the nanosheet stack, thereby exposing portions of the channel and negatively impacting the IC's performance. Because the ESI region is over the nanosheet stack, the undercut region being extensive only exposes portions of the ESI region and does not expose portions of the nanosheet stack, thereby enabling the first type of gate element between the ESI region and the nanosheet stack to remain intact and preventing the IC's performance from being negatively impacted by the presence of the undercut region.

Additionally, the location of the ESI region over the nanosheet stack electrically isolates the nanosheet stack from a portion of a second type of gate element that can be present adjacent the first gate element and above the ESI region. More specifically, in some embodiments of the invention, the fabrication operations used to form the first type of gate element includes applying a gate etch operation to the first type of gate element, which can result in the first type of gate element being undercut. The second gate element is formed on another portion of the IC and, because of the undercut, extends over the ESI region. Without the presence of the ESI region over the nanosheet stack, the undercut region can be sufficiently extensive to allow the second gate element to extend over and contact the nanosheet stack, thereby negatively impacting the IC's performance. Because the ESI region is over the nanosheet stack, the undercut region being extensive only exposes portions of the ESI region to the second gate element and does not expose portions of the nanosheet stack to the second gate element, thereby electrically isolating the nanosheet stack from the second gate element.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

References in the specification to terms such as "vertical," "horizontal," "lateral," etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor structure according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) comprising:
- a channel comprising a nanosheet stack;
- an etch-stop isolation (ESI) region over the nanosheet stack;
- a portion of a first type of gate element between the ESI region and the nanosheet stack; and
- a portion of a second type of gate element present adjacent the first type of gate element and over the ESI region;
- wherein, because of an undercut region of the first type of gate element, the portion of the second type of gate element extends over the ESI region; and
- wherein the ESI region is operable to:
  - prevent etching the portion of the first type of gate element that is between the ESI region and the nanosheet stack; and
  - electrically isolate the nanosheet stack from the portion of the second type of gate element and prevent the portion of the second type of gate element from contacting the nanosheet stack.

2. The IC of claim 1, wherein:
- the portion of the second type of gate element comprises a work function metal (WFM) configured to set a threshold voltage of a transistor associated with the portion of the second type of gate element; and
- the WFM is deposited as a conformal layer over the ESI region.

3. The IC of claim 2, wherein the ESI region comprises a dielectric material.

4. The IC of claim 3, wherein the ESI region is operable to electrically isolate the portion of the second type of gate element from the nanosheet stack.

5. The IC of claim 2, wherein the first type of gate element comprises an undercut surface.

6. The IC of claim 5, wherein the second type of gate element contacts the first type of gate element at the undercut surface.

7. The IC of claim 2, wherein the first type of gate element comprises a first WFM configured to set a threshold voltage of a transistor including the nanosheet stack.

8. The IC of claim 7, wherein the second type of gate element comprises a second WFM that is different from the first WFM.

9. An integrated circuit (IC) comprising:
- a first channel comprising a first nanosheet stack;
- a second channel comprising a second nanosheet stack separated from the first nanosheet stack by a first isolation region;
- a second isolation region comprising an etch-stop isolation (ESI) region over the first nanosheet stack;
- a portion of a first type of gate element between the ESI region and the first nanosheet stack; and
- a second type of gate element over and around the second nanosheet stack;
- wherein a portion of the second type of gate element is adjacent the first type of gate element and over the ESI region;
- wherein, because of an undercut region of the first type of gate element, the portion of the second type of gate element extends over the ESI region; and
- wherein the ESI region is operable to:
  - prevent etching the portion of the first type of gate element that is between the ESI region and the first nanosheet stack; and
  - electrically isolate the first nanosheet stack from the portion of the second type of gate element and prevent the portion of the second type of gate element from contacting the first nanosheet stack.

10. The IC of claim 9, wherein:
- a portion of the second type of gate element is over the ESI region; and
- the portion of the second type of gate element comprises a work function metal (WFM).

11. The IC of claim 10, wherein the ESI region comprises a dielectric material.

12. The IC of claim 11, wherein the ESI region is operable to electrically isolate the portion of the second type of gate element from the first nanosheet stack.

13. The IC of claim 10, wherein the first type of gate element comprises an undercut surface.

14. The IC of claim 13, wherein the second type of gate element contacts the first type of gate element at the undercut surface.

15. The IC of claim 10, wherein the first type of gate element comprises a first WFM configured to set a threshold voltage of a transistor including the first nanosheet stack.

16. The IC of claim 15, wherein the second type of gate element comprises a second WFM that is different from the first WFM.

17. A method of performing integrated circuit (IC) fabrication operations, the method comprising:
- forming a first channel comprising a first nanosheet stack;
- forming an etch-stop isolation (ESI) region over the first nanosheet stack;
- forming a first type of gate element such that a portion of the first type of gate element is between the ESI region and the first nanosheet stack;
- forming a second type of gate element such that a portion of the second type of gate element is present adjacent the first type of gate element and over the ESI region; and
- etching the first type of gate element to form an undercut region such that the portion of the second type of gate element extends over the ESI region;
- wherein the ESI region is operable to:
  - prevent etching the portion of the first type of gate element that is between the ESI region and the first nanosheet stack; and
  - electrically isolate the first nanosheet stack from the portion of the second type of gate element and prevent the portion of the second type of gate element from contacting the first nanosheet stack.

18. The method of claim 17 further comprising:
- forming a second channel comprising a second nanosheet stack;
- forming an isolation region operable to separate the first nanosheet stack from the second nanosheet stack; and forming a second type of gate element over and around the second nanosheet stack, wherein a portion of the second type of gate element over the ESI region.

19. The method of claim 18, wherein:

the ESI region is operable to electrically isolate the portion of the second type of gate element from the first nanosheet stack;

the first type of gate element comprises an undercut surface; and the second type of gate element contacts the first type of gate element at the undercut surface.

20. The method of claim 18, wherein:

the first type of gate element comprises a first work function metal (WFM) configured to set a threshold voltage of a transistor including the first nanosheet stack; and the second type of gate element comprises a second WFM that is different from the first WFM and is configured to set a threshold voltage of a transistor including the second nanosheet stack.

* * * * *